United States Patent
Ozaki et al.

(10) Patent No.: US 9,552,980 B2
(45) Date of Patent: Jan. 24, 2017

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Takashi Ozaki, Toyama (JP); Hideki Horita, Toyama (JP)

(73) Assignee: HITACHI KOKUSAI ELECTRIC INC., Tokyo (JP)

(*) Notice: Subject to any disclaimer, the term of this patent is extended or adjusted under 35 U.S.C. 154(b) by 143 days.

(21) Appl. No.: 14/230,310

(22) Filed: Mar. 31, 2014

(65) Prior Publication Data
US 2014/0315393 A1 Oct. 23, 2014

(30) Foreign Application Priority Data
Apr. 22, 2013 (JP) .................. 2013-089538

(51) Int. Cl.
| | |
|---|---|
| C23C 16/00 | (2006.01) |
| H01L 21/02 | (2006.01) |
| H01L 21/67 | (2006.01) |
| H01L 21/321 | (2006.01) |
| C23C 16/02 | (2006.01) |

(Continued)

(52) U.S. Cl.
CPC ..... *H01L 21/02211* (2013.01); *C23C 16/0218* (2013.01); *C23C 16/402* (2013.01); *C23C 16/45527* (2013.01); *H01L 21/0228* (2013.01); *H01L 21/02164* (2013.01); *H01L 21/02304* (2013.01); *H01L 21/02312* (2013.01); *H01L 21/32105* (2013.01); *H01L 21/67109* (2013.01)

(58) Field of Classification Search
CPC ............... C23C 16/0218; C23C 16/402; C23C 16/45527
See application file for complete search history.

(56) References Cited

U.S. PATENT DOCUMENTS

| | | | |
|---|---|---|---|
| 6,834,656 B2 * | 12/2004 | Qingyuan | B08B 7/0035 134/1.1 |
| 8,901,013 B2 | 12/2014 | Yuasa et al. | |
| 2001/0027031 A1 | 10/2001 | Hasebe et al. | |

(Continued)

FOREIGN PATENT DOCUMENTS

| | | |
|---|---|---|
| CN | 1934685 A | 3/2007 |
| CN | 101807525 A | 8/2010 |

(Continued)

OTHER PUBLICATIONS

The Chinese Office Action issued on Nov. 7, 2016 in the Chinese Application No. 201410110733.0.

*Primary Examiner* — Kelly M Gambetta
(74) *Attorney, Agent, or Firm* — Volpe and Koenig, P.C.

(57) ABSTRACT

A method of manufacturing a semiconductor device includes: pre-treating a surface of a substrate by supplying an oxygen-containing gas and a hydrogen-containing gas to the substrate heated in a process chamber under a pressure less than atmospheric pressure; and forming a film on the pre-treated substrate by performing a cycle a predetermined number of times. The cycle includes: supplying a precursor gas to the substrate in the process chamber; and supplying a reaction gas to the substrate in the process chamber.

13 Claims, 12 Drawing Sheets

(51) Int. Cl.
*C23C 16/40* (2006.01)
*C23C 16/455* (2006.01)

(56) References Cited

U.S. PATENT DOCUMENTS

| | | |
|---|---|---|
| 2002/0048635 A1 | 4/2002 | Kim et al. |
| 2003/0232501 A1* | 12/2003 | Kher .................. C23C 16/0218 |
| | | 438/689 |
| 2005/0260357 A1 | 11/2005 | Olsen et al. |
| 2006/0032442 A1 | 2/2006 | Hasebe |
| 2007/0157882 A1 | 7/2007 | Ozaki et al. |
| 2009/0169768 A1* | 7/2009 | Ueda ................. H01L 21/28247 |
| | | 427/569 |
| 2010/0105192 A1* | 4/2010 | Akae ................. C23C 16/45525 |
| | | 438/478 |
| 2012/0045903 A1 | 2/2012 | Harada et al. |

FOREIGN PATENT DOCUMENTS

| | | |
|---|---|---|
| CN | 102376640 A | 3/2012 |
| JP | 2000-160342 A | 6/2000 |
| JP | 2001-338922 A | 12/2001 |
| JP | 2004-006699 A | 1/2004 |
| JP | 2006-054432 A | 2/2006 |
| JP | 2006-190787 A | 7/2006 |
| JP | 2010-153776 A | 7/2010 |
| KR | 10-2013-0020795 A | 2/2013 |
| TW | 201030847 A1 | 8/2010 |

\* cited by examiner

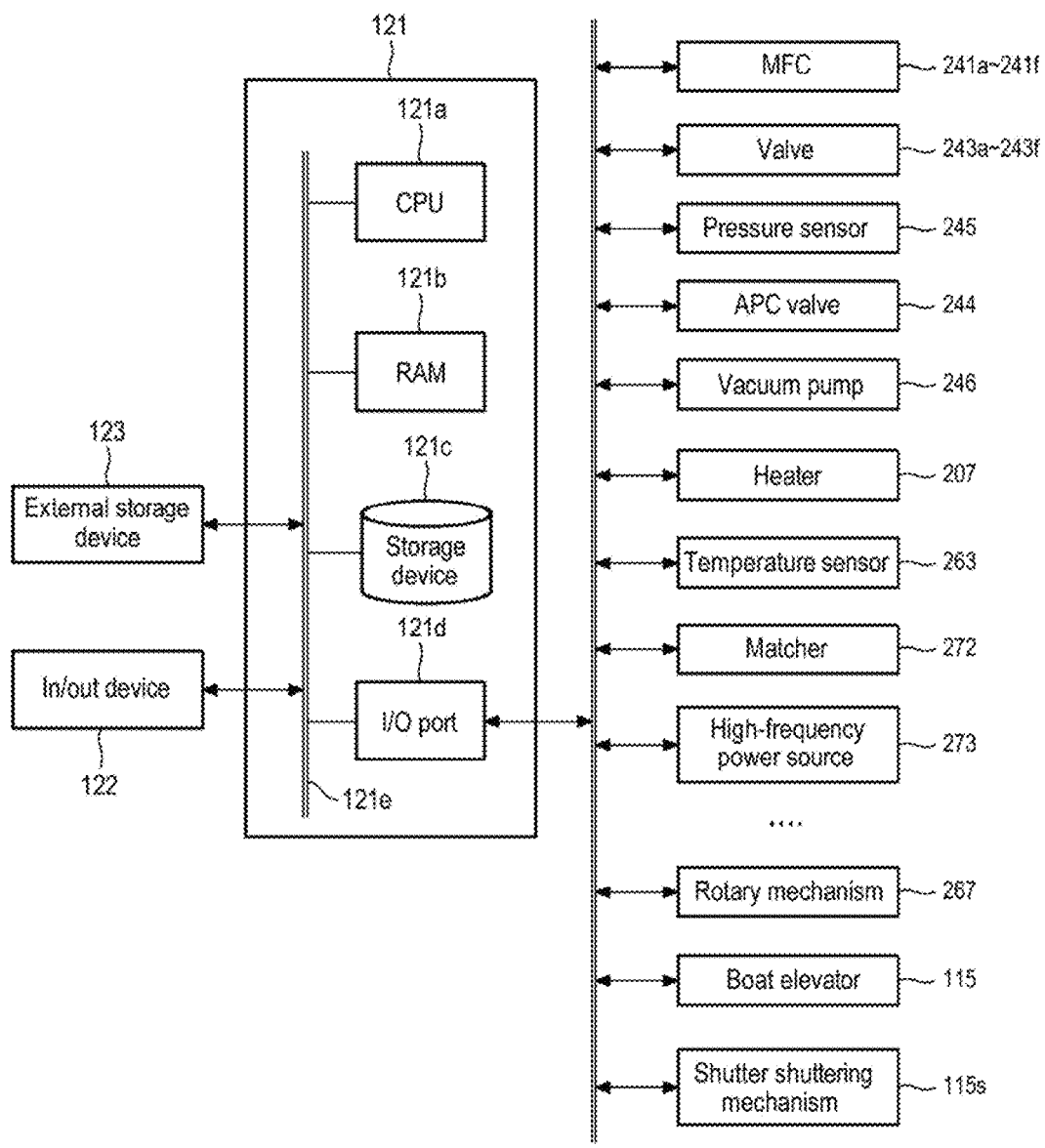

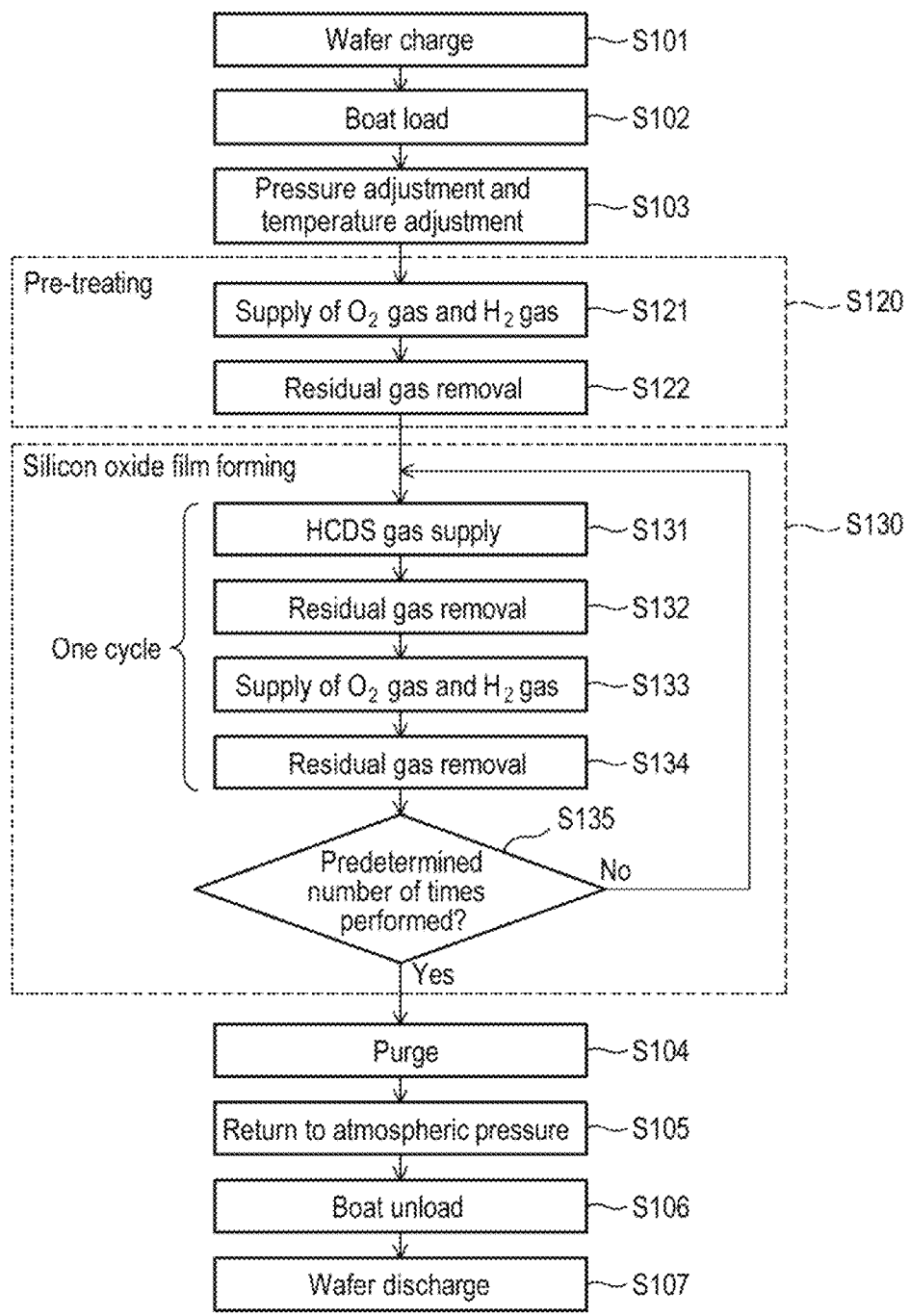

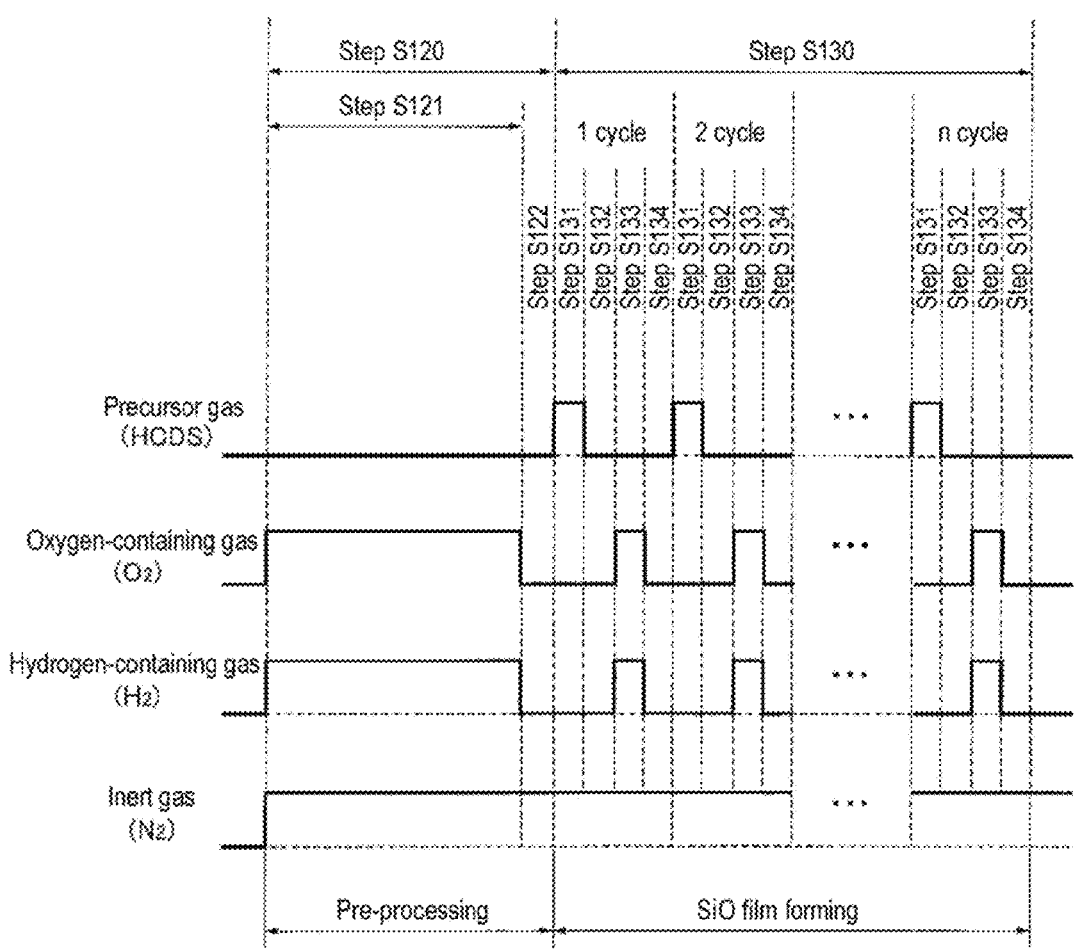

FIG. 7

[Thick film conditions]

| | Conventional method | | Method of the present disclosure |
|---|---|---|---|
| TOP | ±0.62% | ⇒ | ±0.26% |
| CNT | ±0.91% | ⇒ | ±0.50% |
| BTM | ±0.88% | ⇒ | ±0.52% |

[Thin film conditions]

| | Conventional method | | Method of the present disclosure |
|---|---|---|---|
| TOP | ±1.92% | ⇒ | ±0.38% |
| CNT | ±2.34% | ⇒ | ±0.71% |
| BTM | ±2.51% | ⇒ | ±0.74% |

FIG. 11

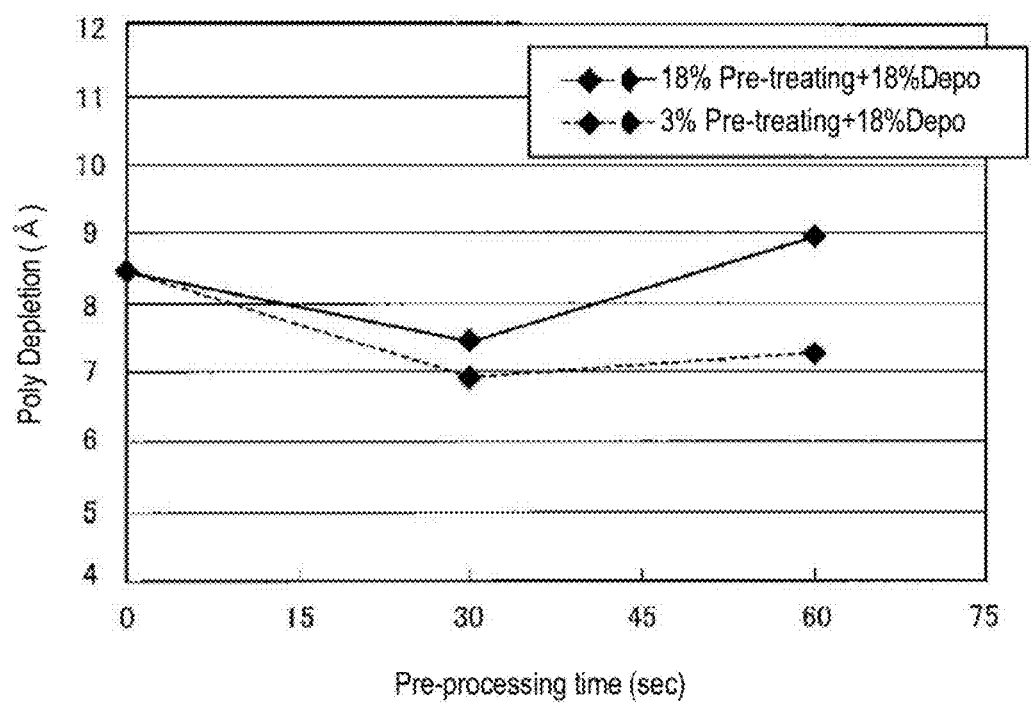

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2013-089538, filed on Apr. 22, 2013, the entire contents of which are incorporated herein by reference.

TECHNICAL FIELD

The present disclosure relates to a method of manufacturing a semiconductor device, a substrate processing apparatus and a recording medium and more particularly relates to a method of manufacturing a semiconductor device, which includes a process of forming a film on a substrate in a process chamber by supplying a precursor gas and a reaction gas to the substrate, a substrate processing apparatus and a recording medium.

BACKGROUND

When manufacturing a semiconductor device, a process of forming a film on a substrate by performing a cycle a predetermined number of times, the cycle including: supplying a precursor gas and a reaction gas to a substrate in a process chamber, may be performed.

The film formed on the substrate requires excellent film thickness uniformity.

SUMMARY

The present disclosure provides some embodiments of a method of manufacturing a semiconductor device, which is capable of forming a film having excellent film thickness uniformity, a substrate processing apparatus and a recording medium.

According to one embodiment of the present disclosure, there is provided a method of manufacturing a semiconductor device, including: pre-treating a surface of a substrate by supplying an oxygen-containing gas and a hydrogen-containing gas to the substrate heated in a process chamber under a pressure less than atmospheric pressure; and forming a film on the pre-treated substrate by performing a cycle a predetermined number of times, the cycle including: supplying a precursor gas to the substrate in the process chamber; and supplying a reaction gas to the substrate in the process chamber.

According to another embodiment of the present disclosure, there is provided a substrate processing apparatus including: a process chamber configured to accommodate a substrate; a heater configured to heat the substrate in the process chamber; a gas supply system configured to supply a gas into the process chamber; a pressure adjusting part configured to adjust the internal pressure of the process chamber; and a controller configured to control the heater, the gas supply system and the pressure adjusting part to perform a process of: pre-treating a surface of the substrate by supplying an oxygen-containing gas and a hydrogen-containing gas from the gas supply system to the substrate heated by the heater in the process chamber set to a pressure less than atmospheric pressure by control of the pressure adjusting part; and forming a film on the pre-treated substrate by performing a cycle a predetermined number of times, the cycle including: supplying a precursor gas from the gas supply system to the substrate in the process chamber; and supplying a reaction gas from the gas supply system to the substrate in the process chamber.

According to still another embodiment of the present disclosure, there is provided a non-transitory computer-readable recording medium storing a program that causes a computer to perform a process of: pre-treating a surface of a substrate by supplying an oxygen-containing gas and a hydrogen-containing gas to the substrate heated in a process chamber under a pressure less than atmospheric pressure; and forming a film on the pre-treated substrate by performing a cycle a predetermined number of times, the cycle including: supplying a precursor gas to the substrate in the process chamber; and supplying a reaction gas to the substrate in the process chamber.

BRIEF DESCRIPTION OF THE DRAWINGS

FIG. 3 is a block diagram illustrating a controller of the substrate processing apparatus according to some embodiments.

FIG. 4 is a flowchart illustrating a processing flow according to some embodiments.

FIG. 5 is a timing chart illustrating gas supply timings in a film-forming sequence according to some embodiments.

FIG. 7 is a view illustrating an in-plane film thickness distribution and an in-plane film thickness uniformity of a SiO film.

FIG. 11 is a view illustrating a relationship between a pre-treating time and an in-plane film thickness distribution of the SiO film.

FIG. 12 is a view illustrating a correlation between a pre-treating time and an amount of oxidation of the base Si.

DETAILED DESCRIPTION

Figure 6A:
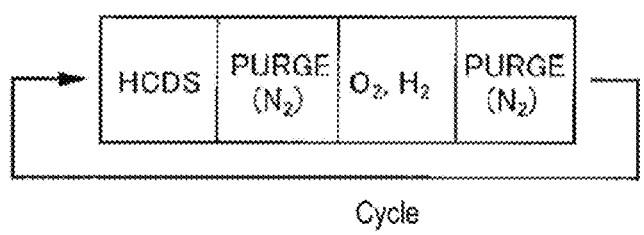
FIG. 6A is a view illustrating a film-forming process without pre-treating and FIG. 6B is a view illustrating a film-forming process with pre-treating.

The present inventors have discovered that, when an oxide film is formed on a silicon (Si) substrate such as a silicon wafer by performing a cycle a predetermined number of times, the cycle including: supplying a hexachlrorodisilane ($Si_2Cl_6$, abbreviated to HCDS) gas as a Si source to the Si substrate; removing the HCDS gas by nitrogen-purging; supplying a $H_2$ gas and an $O_2$ gas to the Si substrate; and removing the $H_2$ gas and the $O_2$ gas by nitrogen-purging, in-plane film thickness uniformity of the Si substrate tends to deteriorate, impurities such as Cl and the like are likely to remain at an interface between the Si substrate and the oxide film, and the base Si of the Si substrate tends to be oxidized, as illustrated in FIG. 6A.

The present inventors have carefully studied the foregoing in order to solve these problems and have found the following facts.

The film thickness uniformity tends to deteriorate when an oxide film having a film thickness of 100 Å (10 nm) or less (hereinafter referred to as a thin film) is formed, but it is relatively good in a case where an oxide film having a film thickness exceeding 100 Å (hereinafter referred to as a thick film) is formed. Considering that the thin film has poor film thickness uniformity and the thick film has relatively good film thickness uniformity, it is believed that there is something wrong during the initial stage of film formation.

When forming a thick film, a base of film formation in the initial stage of the film formation is Si, and a base of film formation in a later stage of the film formation is an oxide film (SiO film). When the HCDS gas is supplied as a Si source in a state where the base Si is exposed, the HCDS gas is non-uniformly adsorbed onto a surface of the base Si or Si is non-uniformly deposited on the surface of the base Si, resulting in the deterioration of film thickness uniformity.

Figure 6B:
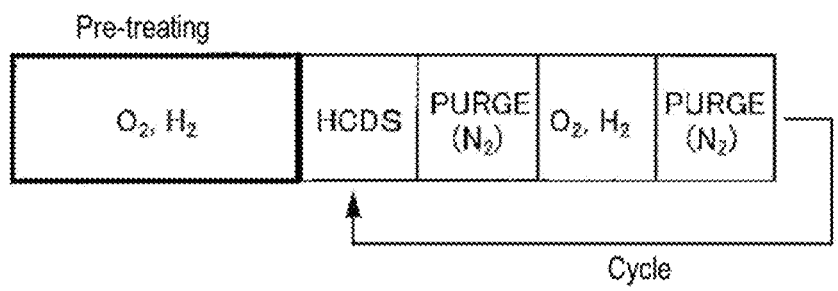

It is therefore believed that, if the base of film formation in the initial stage of the film formation of the thick film becomes the same state as the SiO film as in the later stage of the film formation, the film thickness uniformity may be improved. Further, instead of adsorbing the HCDS gas onto the surface of the base Si or depositing Si on the surface of the base Si by first supplying the HCDS gas as the Si source (see FIG. 6A), by first pre-treating to supply a $H_2$ gas and an $O_2$ gas such that the surface of the base Si can be slightly oxidized and made into SiO, the surface of the base Si in the initial stage of the film formation may have the same condition as the base surface in the later stage of the film formation, as illustrated in FIG. 6B. Thereafter, an oxide film is formed on the pre-treated Si substrate by repeating a cycle including: supplying the HCDS gas as the Si source to the Si substrate; removing the HCDS gas by nitrogen-purging; supplying the $H_2$ gas and the $O_2$ gas to the Si substrate; and removing the $H_2$ gas and the $O_2$ gas by nitrogen-purging.

As a result, even in a case where a thin film of 100 Å or less is formed, environments similar to those in the later stage of the film formation in which a thick film exceeding 100 Å is formed may be created. Accordingly, even in the case where a thin film of 100 Å or less is formed, in-plane film thickness uniformity can be significantly improved. It is believed that, with the above-described pre-treating, at least one uniform, high quality and high density oxide layer is formed in the surface of the base Si, the HCDS gas is uniformly adsorbed onto the oxide layer, and Si is uniformly deposited on the oxide layer.

It is also confirmed that a concentration of impurities such as Cl is reduced at the interface between the Si substrate and the oxide film. It is believed that this is because the impurities on the surface of the base Si are removed when the at least one uniform, high quality and high density oxide layer is formed on the surface of the base Si while the HCDS gas is easily adsorbed onto the base Si and a large amount of impurities such as Cl is introduced into the base Si. It is also believed that the existence of the oxide layer can suppress adsorption of impurities such as Cl.

It is also confirmed that oxidation of the base Si is suppressed. It is believed that the at least one uniform, high quality and high density oxide layer formed on the surface of the base Si acts as an oxidation block layer (oxidation barrier layer) to suppress unintended oxidation of the base Si.

In one example, a thickness of the oxide layer formed by the pre-treating is set by supplying the $H_2$ gas and the $O_2$ gas to fall within a range of 0.1 to 10 Å. The above-described effect cannot be obtained if the thickness of the oxide layer is less than 0.1 Å and the base Si may be excessively oxidized if the thickness of the oxide layer exceeds 10 Å, both of which are undesirable.

One embodiment of the present disclosure will now be described with reference to the drawings. The embodiment is based on the findings obtained by the present inventors.

Embodiment (1) Configuration of Substrate Processing Apparatus

Figure 1:
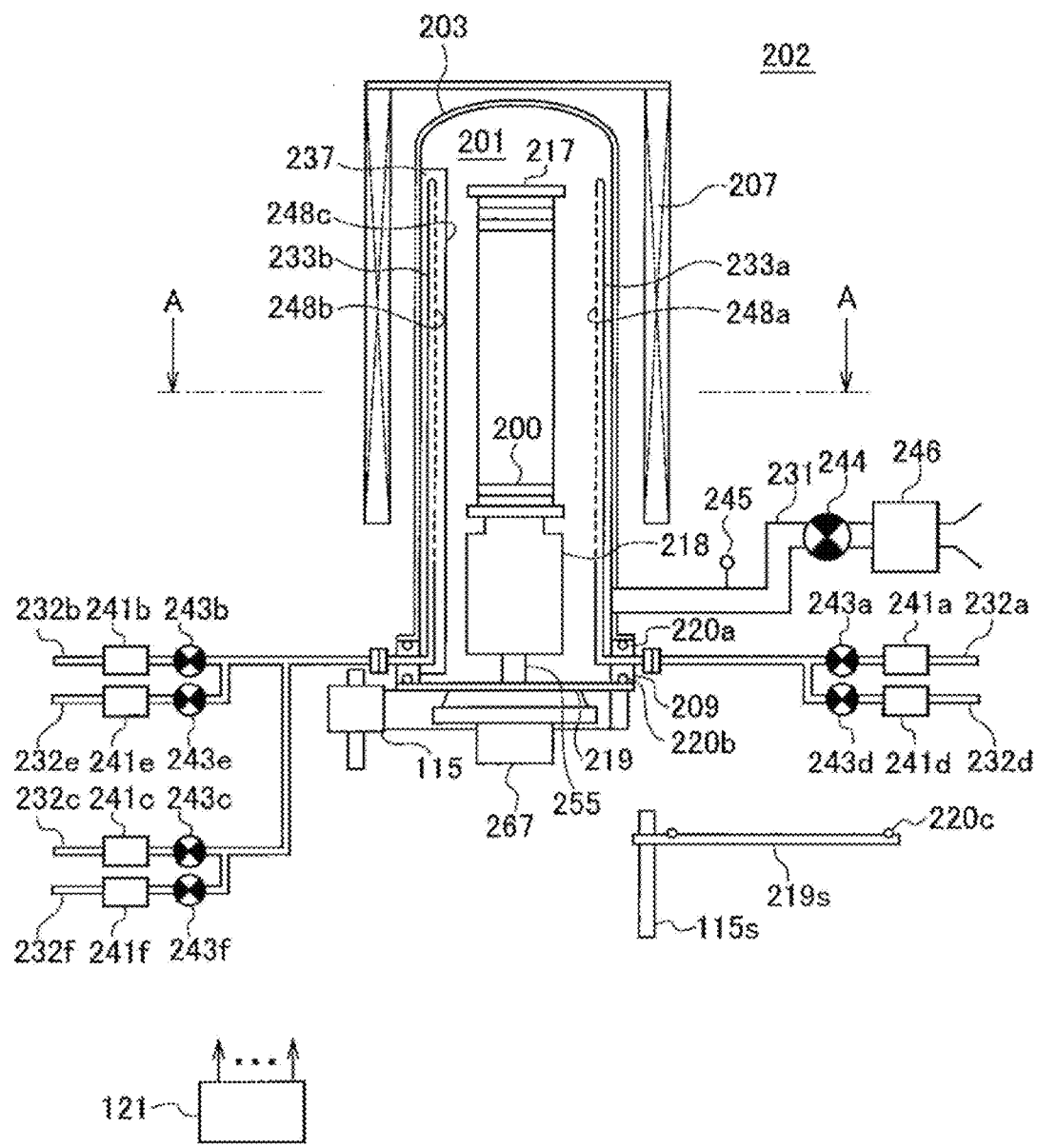
FIG. 1 is a schematic longitudinal sectional view illustrating a vertical processing furnace of a substrate processing apparatus according to some embodiments.

As shown in FIG. 1, a processing furnace 202 has a heater 207 serving as a heating unit (heating mechanism). The heater 207 has a cylindrical shape and is supported by a heater base (not shown) as a support plate so as to be vertically installed. The heater 207 acts as an activating mechanism (exciting unit) to activate (excite) a gas by heat, as will be described later.

A reaction tube 203 is disposed inside the heater 207 in a concentric form along the heater 207. The reaction tube 203 is made of a heat resistant material such as, for example, quartz ($SiO_2$), silicon carbide (SiC) or the like and has a cylindrical shape with its upper end closed and its lower end opened. Below the reaction tube 203 is disposed a manifold (inlet flange) 209 in a concentric form along the reaction tube 203. The manifold 209 is made of metal such as stainless steel and has a cylindrical shape with its upper and lower ends opened. The top side of the manifold 209 is configured to support the reaction tube 203 in engagement with the bottom side of the reaction tube 203. Also, an O-ring 220a serving as a seal member is interposed between the manifold 209 and the reaction tube 203. The manifold 209 is supported by a heater base (not shown), and the reaction tube 203 remains in a vertical posture. A process vessel (reaction vessel) is mainly configured by the reaction tube 203 and the manifold 209. A process chamber 201 is provided in a hollow cylindrical portion of the reaction tube 203 and is configured to accommodate a plurality of wafers 200 that are substrates. The wafers 200 are horizontally stacked in multiple stages to be aligned in a vertical direction in a boat 217 which will be described later.

Within the process chamber 201 are installed a first nozzle 233a serving as a first gas introduction portion and a second nozzle 233b serving as a second gas introduction portion penetrating through a side wall of the manifold 209. A first gas supply pipe 232a is connected to the first nozzle 233a. A second gas supply pipe 232b and a third gas supply pipe 232c are connected to the second nozzle 233b. In this way, the two nozzles 233a and 233b and the three gas supply pipes 232a, 232b and 232c are provided in the reaction tube 203, thereby allowing several types of (3 in this example) gases to be supplied into the process chamber 201.

A mass flow controller (MFC) 241a serving as a flow rate controller (a flow rate controller) and an opening/closing valve 243a are installed in the first gas supply pipe 232a in this order from an upstream direction. In addition, a first inert gas supply pipe 232d is connected to a downstream side of the valve 243a of the first gas supply pipe 232a. A MFC 241f serving as a flow rate controller and an opening/closing valve 243d are installed in the first inert gas supply pipe 232d in this order from an upstream direction. In addition, the above-mentioned first nozzle 233a is connected to a leading end of the first gas supply pipe 232a. The first nozzle 233a is vertically installed along an inner wall of the reaction tube 203 in a circular arc-shaped space between the inner wall of the reaction tube 203 and the wafers 200 to rise upward in a stacking direction of the wafers 200. That is, the first nozzle 233a is installed in a flank of a wafer arrangement region where the wafers 200 are arranged. The first nozzle 233a is configured as an L-shaped long nozzle and has its horizontal portion disposed to penetrate through a side wall of the manifold 209 and its vertical portion disposed to rise from at least one end of the wafer arrangement region toward the other end thereof. A plurality of gas supply holes 248a through which gas is supplied is disposed at a side surface of the first nozzle 233a. The gas supply holes 248a are opened toward a center of the reaction tube 203 to supply gas to the wafers 200. The gas supply holes 248a are disposed at a predetermined opening pitch from a lower portion to an upper portion of the reaction tube 203. Each of the gas supply holes 250a has the same opening area.

A first gas supply system is mainly configured by the first gas supply pipe 232a, the MFC 241a and the valve 243a. The first nozzle 249a may also be included in the first gas supply system. In addition, a first inert gas supply system is mainly configured by the first inert gas supply pipe 232d, the MFC 241d and the valve 243d. The first inert gas supply system also functions as a purge gas supply system.

A MFC 241b serving as a flow rate controller and an opening/closing valve 243b are installed in the second gas supply pipe 232b in this order from an upstream direction. In addition, a second inert gas supply pipe 232e is connected to a downstream side of the valve 243b of the second gas supply pipe 232b. A MFC 241e serving as a flow rate controller and an opening/closing valve 243e are installed in the second inert gas supply pipe 232e in this order from an upstream direction. In addition, the above-mentioned second nozzle 249b is connected to a leading end of the second gas supply pipe 232b. The second nozzle 249b is installed in a buffer chamber 237 which is a gas diffusion space.

The buffer chamber 237 is vertically installed in an arc-shaped space between the inner wall of the reaction tube 203 and the wafers 200 along the inner wall of the reaction tube 203 in the stacking direction of the wafers 200. That is, the buffer chamber 237 is installed in the flank of the wafer arrangement region where the wafers 200 are arranged. A plurality of gas supply holes 248c through which gas is supplied is disposed at an end portion of a wall of the buffer chamber 237 adjacent to the wafers 200. The gas supply holes 248c are opened toward the center of the reaction tube 203 so that the gas can be supplied toward the wafers 200. The gas supply holes 248c are disposed at a predetermined opening pitch from a lower portion to an upper portion of the reaction tube 203. Each of the gas supply holes 250b has the same opening area.

The second nozzle 233b is installed along the inner wall of the reaction tube 203 to rise upward in the stacking direction of the wafers 200 in an end portion of the buffer chamber 237 opposite to the end portion thereof in which the gas supply holes 248c are formed. That is, the nozzle 233b is installed in the flank of the wafer arrangement region, in which the wafers 200 are arranged. The second nozzle 233b is configured as an L-shaped long nozzle and has its horizontal portion installed to penetrate through the sidewall of the manifold 209 and its vertical portion installed to rise from at least one end portion of the wafer arrangement region toward the other end portion thereof. A plurality of gas supply holes 248b through which gas is supplied is formed at a side surface of the nozzle 233b. The gas supply holes 248b are opened toward the center of the buffer chamber 237. The gas supply holes 248b are disposed from the lower portion to the upper portion of the reaction tube 203, like the gas supply holes 248c of the buffer chamber 237. The plurality of gas supply holes 248b may have the same opening area and the same opening pitch from an upstream side (lower portion) to a downstream side (upper portion) when a pressure difference between the interior of the buffer chamber 237 and the interior of the process chamber 201 is small. However, when the pressure difference is large, the opening area of each gas supply hole 248b may be set larger and the opening pitch of each gas supply hole 248b may be set smaller at the downstream side than the upstream side.

In this embodiment, by adjusting the opening area or opening pitch of each gas supply hole 248b of the second nozzle 233b from the upstream side to the downstream side as described above, gases may be ejected at substantially the same flow rate from the respective gas supply holes 248b despite a flow velocity difference. In addition, the gases ejected from the respective gas supply holes 248b are first introduced into the buffer chamber 237, and a flow velocity difference of the gases becomes uniform in the buffer chamber 237. That is, particle velocity of the gases ejected from the respective gas supply holes 248b into the buffer chamber 237 is reduced in the buffer chamber 237, and then are ejected from the respective gas supply holes 248c into the process chamber 201. Therefore, the gases ejected from the respective gas supply holes 248b of the second nozzle 233b into the buffer chamber 237 have a uniform flow rate and flow velocity when the gases are ejected from the respective gas supply holes 248c into the process chamber 201.

A second gas supply system is mainly configured by the second gas supply pipe 232b, the MFC 241b and the valve 243b. The second nozzle 233b and the buffer chamber 237 may be included in the second gas supply system. In addition, a second inert gas supply system is mainly configured by the second inert gas supply pipe 232e, the MFC 241e and the valve 243e. The second inert gas supply system also functions as a purge gas supply system.

A MFC 241c serving as a flow rate controller and an opening/closing valve 243c are installed in the third gas supply pipe 232c in this order from an upstream direction. In addition, a third inert gas supply pipe 232f is connected to a downstream side of the valve 243c of the third gas supply pipe 232c. A MFC 241f serving as a flow rate controller and an opening/closing valve 243f are installed in the third inert gas supply pipe 232f in this order from an upstream direction. In addition, a leading end portion of the third gas supply pipe 232c is connected to a downstream side of the valve 243b of the second gas supply pipe 232b.

A third gas supply system is mainly configured by the third gas supply pipe 232c, the MFC 241c and the valve 243c. The second nozzle 233b, the buffer chamber 237 and a downstream side of a connection position of the second gas supply pipe 232b to the third gas supply pipe 232c may be included in the third gas supply system. A third inert gas supply system is mainly configured by the third inert gas supply pipe 232f, the MFC 241f and the valve 243f. The third inert gas supply system also functions as a purge gas supply system.

In the method of supplying gas according to the embodiment, the gas may be transferred through the nozzles 233a and 233b and the buffer chamber 237 disposed in an arc-shaped longitudinal space defined by the inner wall of the reaction tube 203 and end portions of the stacked wafers

200. The gas is first ejected into the reaction tube 203 near the wafers 200 through the gas supply holes 248*a*, 248*b* and 248*c* opened in the nozzles 233*a* and 233*b* and the buffer chamber 237, respectively. Thus, a main flow of the gas in the reaction tube 203 follows a direction parallel to surfaces of the wafers 200, i.e., a horizontal direction. With this configuration, the gas can be uniformly supplied to the respective wafers 200, and thus, a film thickness of a thin film formed on each of the wafers 200 can be uniform. In addition, a gas flowing on the surface of the wafer 200 after reaction, i.e., a residual gas, flows toward an exhaust port, i.e., an exhaust pipe 231 to be described later, but a flow direction of the residual gas is not limited to the vertical direction but may be appropriately adjusted by a position of the exhaust port.

As a gas containing a predetermined element and a halogen element, i.e., a precursor gas containing silicon (Si) as a predetermined element and chlorine (Cl) as a halogen element (silicon and chlorine-containing as), for example, a hexachlorodisilane ($Si_2Cl_6$, abbreviation: HCDS) gas, which is a chlorosilane-based gas, is supplied from the first gas supply pipe 232*a* into the process chamber 201 through the MFC 241*a*, the valve 243*a* and the first nozzle 233*a*. That is, the first gas supply system is configured as a precursor gas supply system, i.e., a silicon and chlorine-containing gas supply system (HCDS gas supply system). As used herein, the chlorosilane-based precursor gas refers to a gaseous chlorosilane-based precursor gas (for example, a chlorosilane-based precursor in a gas state under room temperature and atmospheric pressure, a gas obtained by vaporizing a chlorosilane-based precursor in a liquid state under room temperature and atmospheric pressure, etc.). In addition, the chlorosilane-based precursor refers to a silane-based precursor having a chloro group as a halogen group, containing at least Si and Cl. That is, the chlorosilane-based precursor may refer to a kind of halide. In the specification, the term "precursor" may refer to "a liquid precursor in a liquid state," "a precursor gas in a gaseous state," or both of them. Accordingly, the term "chlorosilane-based precursor" used in the description may refer to "a chlorosilane-based precursor in a liquid state," "a chlorosilane-based precursor gas in a gaseous state," or both of them. For example, hexachlorodisilane ($Si_2Cl_6$, abbreviation: HCDS) may be used as the chlorosilane-based precursor. In addition, when a liquid precursor in the liquid state under room temperature and atmospheric pressure, such as the HCDS, is used, the liquid precursor is evaporated by an evaporation system such as an evaporator, a bubbler, or the like, and is supplied as a precursor gas (HCDS gas).

As an oxidizing gas, i.e., a gas containing oxygen (oxygen-containing gas), for example, an oxygen ($O_2$) gas is supplied from the second gas supply pipe 232*b* into the process chamber 201 via the MFC 241*b*, the valve 243*b*, the second gas supply pipe 232*b*, the second nozzle 233*b* and the buffer chamber 237. That is, the second gas supply system is configured as an oxygen-containing gas supply system ($O_2$ gas supply system).

As a reducing gas, i.e., a gas containing hydrogen (hydrogen-containing gas), for example, a hydrogen ($H_2$) gas is supplied from the third gas supply pipe 232*c* into the process chamber 201 via the MFC 241*c*, the valve 243*c*, the second gas supply pipe 232*b*, the second nozzle 233*b* and the buffer chamber 237. That is, the third gas supply system is configured as a hydrogen-containing gas supply system ($H_2$ gas supply system).

The oxygen-containing gas and the hydrogen-containing gas may be referred to as a reaction gas, in which case a reaction gas supply system is configured by the oxygen-containing gas supply system and the hydrogen-containing gas supply system. A gas supply system is mainly configured by the first to third gas supply system, i.e., the precursor gas supply system and the reaction gas supply system. In addition, the inert gas supply systems may be included in the gas supply system.

Although the $O_2$ gas and the $H_2$ gas are supplied from the same nozzle (i.e., the second nozzle 233*b*) into the process chamber 201 (the buffer chamber 237) in the above-described embodiment, these gases may be supplied from different nozzles into the process chamber 201. However, the supply of multiple kinds of gases in the same nozzle can reduce the number of nozzles and hence apparatus costs and facilitate maintenance. In addition, the nozzle for supplying the HCDS gas and the nozzle for supplying the $H_2$ gas may be used in common. That is, the HCDS gas and the $H_2$ gas may be supplied from the same nozzle. In a certain range of temperature which will be described later, the HCDS gas does not react with the $H_2$ gas. However, the HCDS gas may react with the $O_2$ gas. Thus, it is preferred that the nozzle for supplying the HCDS gas and the nozzle for supplying the $O_2$ gas are provided separately.

Figure 2:
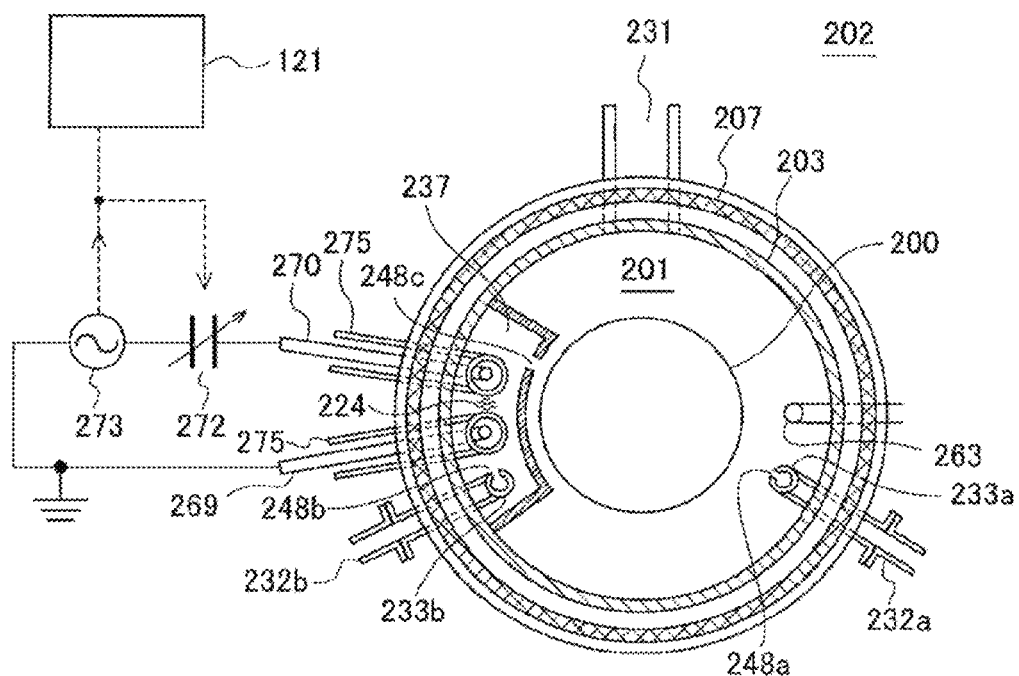
FIG. 2 is a schematic longitudinal sectional view taken along line A-A in FIG. 1.

In the buffer chamber 237, as illustrated in FIG. 2, a first rod-shaped electrode 269, that is a first electrode having an elongated structure, and a second rod-shaped electrode 270, that is a second electrode having an elongated structure, are disposed to span from the lower portion to the upper portion of the reaction tube 203 in the stacking direction of the wafers 200. Each of the first rod-shaped electrode 269 and the second rod-shaped electrode 270 is disposed in parallel to the second nozzle 233*b*. Each of the first rod-shaped electrode 269 and the second rod-shaped electrode 270 is covered with and protected by an electrode protection tube 275, which is a protection tube for protecting each electrode, from an upper portion to a lower portion thereof. Any one of the first rod-shaped electrode 269 and the second rod-shaped electrode 270 is connected to a high-frequency power source 273 through a matcher 272, and the other one is connected to a ground corresponding to a reference electric potential. By applying high-frequency power from the high-frequency power source 273 between the first rod-shaped electrode 269 and the second rod-shaped electrode 270 through the matcher 272, plasma is generated in a plasma generation region 224 between the first rod-shaped electrode 269 and the second rod-shaped electrode 270. A plasma source serving as a plasma generator (plasma generating part) is mainly configured by the first rod-shaped electrode 269, the second rod-shaped electrode 270 and the electrode protection tubes 275. The matcher 272 and the high-frequency power source 273 may also be included in the plasma source. Also, as will be described later, the plasma source functions as an activating mechanism that activates a gas into a plasma state.

The electrode protection tube 275 has a structure in which each of the first rod-shaped electrode 269 and the second rod-shaped electrode 270 can be inserted into the buffer chamber 237 in a state where each of the first rod-shaped electrode 269 and the second rod-shaped electrode 270 is isolated from an internal atmosphere of the buffer chamber 237. Here, when an internal oxygen concentration of the electrode protection tube 275 is equal to an oxygen concentration in an ambient air (atmosphere), each of the first rod-shaped electrode 269 and the second rod-shaped electrode 270 inserted into the electrode protection tubes 275 is oxidized by the heat generated by the heater 207. Therefore, by charging the inside of the electrode protection tube 275 with an inert gas such as a nitrogen gas, or by purging the inside of the electrode protection tube 275 with an inert gas such as a nitrogen gas using an inert gas purging mechanism, the internal oxygen concentration of the electrode protection tube 275 decreases, thereby preventing oxidation of the first rod-shaped electrode 269 or the second rod-shaped electrode 270.

The exhaust pipe 231 for exhausting an internal atmosphere of the process chamber 201 is installed at the reaction tube 203. A vacuum exhaust device, for example, a vacuum pump 246, is connected to the exhaust pipe 231 through a pressure sensor 245, which is a pressure detector (pressure detecting part) for detecting an internal pressure of the process chamber 201, and an auto pressure controller (APC) valve 244, which is a pressure adjuster (pressure adjusting part). The APC valve 244 is configured to perform/stop vacuum exhaust of the process chamber 201 by opening/closing the valve with the vacuum pump 246 actuated, and further to adjust the internal pressure of the process chamber 201 by adjusting a degree of valve opening with the vacuum pump 246 actuated. An exhaust system is mainly configured by the exhaust pipe 231, the APC valve 244 and the pressure sensor 245. Also, the vacuum pump 246 may be included in the exhaust system. The exhaust system is configured to adjust the degree of valve opening of the APC valve 244 based on pressure information detected by the pressure sensor 245 while operating the vacuum pump 246 such that the internal pressure of the process chamber 201 is vacuum-exhausted to a predetermined pressure (a degree of vacuum). The exhaust pipe 231 may be installed at the manifold 209 similarly to the first nozzle 233a or the second nozzle 233b rather than at the reaction tube 203.

A seal cap 219, which functions as a furnace port cover configured to hermetically seal a lower end opening of the reaction tube 203, is installed under the reaction tube 203. The seal cap 219 is configured to contact the lower end of the reaction tube 203 from the below in the vertical direction. The seal cap 219, for example, may be formed of metal such as stainless steel and have a disc shape. An O-ring 220, which is a seal member in contact with the lower end portion of the reaction tube 203, is installed at an upper surface of the seal cap 219. A rotary mechanism 267 configured to rotate the boat 217, which is a substrate holder to be described later, is installed below the seal cap 219. A rotary shaft 255 of the rotary mechanism 267 is formed of metal such as stainless steel and passes through the seal cap 219 to be connected to the boat 217. The rotary mechanism 267 is configured to rotate the wafers 200 by rotating the boat 217. The seal cap 219 is configured to be vertically elevated or lowered by a boat elevator 115, which is an elevation mechanism vertically disposed in the outside of the reaction tube 203. The boat elevator 115 is configured to enable the boat 217 to be loaded into or unloaded from the process chamber 201 by elevating or lowering the seal cap 219. That is, the boat elevator 115 is configured as a transfer device (transfer mechanism) that transfers the boat 217, i.e., the wafers 200, into and out of the process chamber 201. In addition, a shutter 219s serving as a furnace opening cover for air-tightly blocking the bottom opening of the manifold 209 while lowering the seal cap 219 by means of the boat elevator 115 is disposed below the manifold 209. Like the seal cap 219, the shutter 219s is formed of metal such as stainless steel and has a disc shape. An O-ring 220c serving as a seal member contacting the bottom of the manifold 209 is disposed in the top side of the shutter 219s. The opening/closing operation (elevation operation, rotation operation and so on) of the shutter 219s is controlled by a shutter opening/closing mechanism 115s installed outside the reaction tube 203.

The boat 217, which is used as a substrate support, is formed of a heat resistant material such as quartz or silicon carbide and is configured to support a plurality of the wafers 200 horizontally stacked in multiple stages with the centers of the wafers 200 concentrically aligned. In addition, a heat insulating member 218 formed of a heat resistant material such as quartz or silicon carbide is installed at a lower portion of the boat 217 and configured such that heat from the heater 207 cannot be transferred to the seal cap 219. In addition, the heat insulating member 218 may be configured by a plurality of heat insulating plates formed of a heat resistant material such as quartz or silicon carbide, and a heat insulating plate holder configured to support the heat insulating plates horizontally in multiple stages.

As illustrated in FIG. 2, a temperature sensor 263, which is a temperature detector, is installed in the reaction tube 203. Based on temperature information detected by the temperature sensor 263, an electric conduction state to the heater 207 is adjusted such that the interior of the process chamber 201 has a desired temperature distribution. The temperature sensor 263 is configured in an L-shape similar to the nozzles 233a and 233b and installed along the inner wall of the reaction tube 203.

As illustrated in FIG. 3, a controller 121, which is a control part (control means), is configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122, for example, including a touch panel or the like, is connected to the controller 121.

The memory device 121c is configured by, for example, a flash memory, a hard disc drive (HDD), or the like. A control program for controlling operation of the substrate processing apparatus or a process recipe, in which procedures or conditions for processing a substrate described later is written, is readably stored in the memory device 121c. Also, the process recipe functions as a program for the controller 121 to execute each procedure in the substrate processing process, which will be described later, to obtain a predetermined result. Hereinafter, the process recipe or control program may be generally referred to as "a program." Also, when the term "program" is used herein, it may include a case in which only the process recipe is included, a case in which only the control program is included, or a case in which both of the process recipe and the control program are included. In addition, the RAM 121b is configured as a memory area (work area) in which a program or data read by the CPU 121a is temporarily stored.

The I/O port 121d is connected to the MFCs 241a to 241f, the valves 243a to 243f, the pressure sensor 245, the APC valve 244, the vacuum pump 246, the heater 207, the temperature sensor 263, the rotary mechanism 267, the boat elevator 115, the high-frequency power source 273, the matcher 272, the shutter opening/closing mechanism 115s, and the like.

The CPU 121a is configured to read and execute the control program from the memory device 121c. According to an input of an operation command from the input/output device 122, the CPU 121a reads the process recipe from the memory device 121c. In addition, the CPU 121a is configured to control the flow rate controlling operation of various types of gases by the mass flow controllers 241a to 241f, the opening/closing operation of the valves 243a to 243f, the opening/closing operation of the APC valve 244 and the pressure adjusting operation by the APC valve 244 based on the pressure sensor 245, the start/stop operation of the vacuum pump 246, the temperature adjusting operation of the heater 207 based on the temperature sensor 263, the rotation and rotation speed adjusting operation of the boat 217 by the rotary mechanism 267, the elevation operation of the boat 217 by the boat elevator 115, the power supply operation by the high-frequency power source 273, the impedance adjusting operation of the matcher 272, the opening/closing operation of the shutter 219s by the shutter opening/closing mechanism 115s, and the like according to contents of the read process recipe.

Moreover, the controller 121 is not limited to being configured as a dedicated computer but may be configured as a general-purpose computer. For example, the controller 121 according to some embodiments may be configured by preparing an external memory device 123 (for example, a magnetic tape, a magnetic disc such as a flexible disc or a hard disc, an optical disc such as a CD or DVD, a magneto-optical disc such as an MO, a semiconductor memory such as a USB memory or a memory card), in which the program is stored, and installing the program on the general-purpose computer using the external memory device 123. Also, a means for supplying a program to a computer is not limited to the case in which the program is supplied through the external memory device 123. For example, the program may be supplied using a communication means such as the Internet or a dedicated line, rather than through the external memory device 123. Also, the memory device 121c or the external memory device 123 is configured as a non-transitory computer-readable recording medium. Hereinafter, these means for supplying the program will be simply referred to as "a recording medium." In addition, when the term "recording medium" is used herein, it may include a case in which only the memory device 121c is included, a case in which only the external memory device 123 is included, or a case in which both the memory device 121c and the external memory device 123 are included.

(2) Substrate Processing Process

Next, as one of processes of manufacturing a semiconductor device using the processing furnace 202 of the above-described substrate processing apparatus, an example of a sequence of forming a film on a substrate will be described. In the following description, operations of various components constituting the substrate processing apparatus are controlled by the controller 121.

A film forming sequence according to the embodiment will now be described with reference to FIGS. 4 and 5.

In the film forming sequence according to the embodiment, an HCDS gas may be used as a precursor gas, and an $O_2$ gas, which is an oxygen-containing gas, and a $H_2$ gas, which is a hydrogen gas, may be used as a reaction gas. The film forming sequence includes: pre-treating a surface of a wafer 200, which is a substrate accommodated in a process chamber 201, by supplying the $O_2$ gas and the $H_2$ gas to the wafer 200; and forming a silicon oxide ($SiO_2$) film (hereinafter also referred to as a SiO film) having a predetermined composition and a predetermined film thickness on the pre-treated wafer 200 by performing a cycle a predetermined number of times (one or more times), the cycle including: forming a silicon-containing layer on the pre-treated wafer 200 by supplying the HCDS gas to the wafer 200 accommodated in the process chamber 201; and changing the silicon-containing layer into a silicon oxide layer by supplying the $O_2$ gas and the $H_2$ gas to the wafer 200 accommodated in the process chamber 201.

The act of pre-treating the surface of the wafer 200 may include: generating an oxidation species containing oxygen but no water ($H_2O$) by causing the $O_2$ gas and the $H_2$ gas to react with each other in the process chamber 201 by supplying the $O_2$ gas and the $H_2$ gas to the wafer 200 heated in the process chamber 201 under a pressure less than atmospheric pressure; and changing a surface of a silicon layer (base Si) on the surface of the wafer 200 into a silicon oxide layer using the oxidation species.

The act of changing the silicon-containing layer into the silicon oxide layer may include: generating an oxidation species containing oxygen such as atomic oxygen (O) but no water ($H_2O$) by causing the $O_2$ gas and the $H_2$ gas to react with each other in the process chamber 201 by supplying the $O_2$ gas and the $H_2$ gas to the wafer 200 heated in the process chamber 201 under a pressure less than atmospheric pressure; and changing the silicon-containing layer into the silicon oxide layer using the oxidation species.

In the specification, the term "wafer" includes "a wafer itself" and "a laminated body (a collected body) of a wafer and a layer or a film formed thereon (i.e., a wafer including a layer or a film formed on a surface of the wafer)". In the specification, the term "wafer surface" includes "a wafer surface itself" and "a surface of a layer or a film formed on the wafer, i.e., an outermost surface of a wafer as a laminated body."

Therefore, in the specification, the phrase "supplying a predetermined gas onto a wafer" includes "directly supplying a predetermined gas to a (exposed) surface of a wafer itself" and "supplying a predetermined gas to a layer or a film formed on a wafer, i.e., to an outermost surface of a wafer as a laminated body." In the specification, the phrase "forming a layer (or a film) on a wafer" includes "directly forming a layer (or a film) on a (exposed) surface of a wafer itself" and "forming a layer (or a film) on a layer or a film formed on a wafer, i.e., on an outermost surface of a wafer as a laminated body."

In the specification, the term "substrate" may be synonymous with the term "wafer," in which case, the terms "wafer" and "substrate" may be used interchangeably in the above description.

(Wafer Charge and Boat Load)

When the plurality of wafers 200 is charged on the boat 217 (wafer charge: Step S101), the shutter 219s is moved by the shutter opening/closing mechanism 115s to open the bottom opening of the manifold 209 (shutter open). The boat 217 supporting the plurality of wafers 200 is lifted up and loaded into the process chamber 201 by the boat elevator 115 (boat load: Step S102), as shown in FIG. 1. In this state, the seal cap 219 seals the bottom of the manifold 209 via the O-ring 220b.

(Pressure Adjustment and Temperature Adjustment)

The interior of the process chamber 201 is vacuum-exhausted by the vacuum pump 246 to a desired pressure (degree of vacuum). At this time, the internal pressure of the process chamber 201 is measured by the pressure sensor 245 and the APC valve 244 is feedback-controlled based on the measured pressure information (pressure adjustment). The vacuum pump 246 remains activated at least until processing of the wafers 200 is completed. The interior of the process chamber 201 is heated by the heater 207 to a desired temperature. At this time, a state of electric conduction to the heater 207 is feedback-controlled based on the temperature information detected by the temperature sensor 263 such that the interior of the process chamber 201 has a desired temperature distribution (temperature adjustment). The heating of the interior of the process chamber 201 by the heater 207 continues at least until processing of the wafers 200 is completed. Subsequently, the boat 217 and the wafers 200 begin to be rotated by the rotary mechanism 267. The rotation of the boat 217 and the wafers 200 by the rotary mechanism 267 continues at least until processing of the wafers 200 is completed.

(Pre-Treating Process: Step S120)

[Supply of $O_2$ Gas and $H_2$ Gas: Step S121]

Next, the valve 243b of the second gas supply pipe 232b is opened to cause the $O_2$ gas to flow into the second gas supply pipe 232b. A flow rate of the $O_2$ gas flowing through the second gas supply pipe 232b is regulated by the MFC 241b. The $O_2$ gas with its flow rate regulated is supplied from the gas supply holes 248b of the second nozzle 233b into the buffer chamber 237 in a heated and depressurized state via the second gas supply pipe 232b. At the same time, the valve 243c of the third gas supply pipe 232c is opened to cause the $H_2$ gas to flow into the third gas supply pipe 232c. A flow rate of the $H_2$ gas flowing through the third gas supply pipe 232c is regulated by the MFC 241c. The $H_2$ gas with its flow rate regulated is supplied from the gas supply holes 248b of the second nozzle 233b into the buffer chamber 237 in a heated and depressurized state via the third gas supply pipe 232c. While flowing through the second gas supply pipe 232b, the $H_2$ gas is mixed with the $O_2$ gas in the second gas supply pipe 232b. That is, a mixture of the $O_2$ gas and the $H_2$ gas is supplied from the second nozzle 233b. The mixture of the $O_2$ gas and the $H_2$ gas supplied into the buffer chamber 237 is supplied from the gas supply holes 248c of the buffer chamber 237 into the process chamber 201 in a heated and depressurized state and is exhausted from the exhaust pipe 231. At this time, the $O_2$ gas and the $H_2$ gas are supplied to the wafers 200 (supply of $O_2$ gas and $H_2$ gas).

At this time, the valve 243e of the second inert gas supply pipe 232e is opened to cause a $N_2$ gas serving as an inert gas to flow from the second inert gas supply pipe 232e. A flow rate of the $N_2$ gas is regulated by the MFC 241e and the $N_2$ gas with its flow rate regulated is supplied into the second gas supply pipe 232b. In addition, the valve 243f of the third inert gas supply pipe 232f is opened to cause the $N_2$ gas serving as an inert gas to flow from the third inert gas supply pipe 232f. A flow rate of the $N_2$ gas is regulated by the MFC 241f and the $N_2$ gas with its flow rate regulated is supplied into the third gas supply pipe 232c. A mixture of the $O_2$ gas, the $H_2$ gas and the $N_2$ gas is supplied from the second nozzle 233b. Examples of the inert gas may include a rare gas such as an Ar gas, a He gas, a Ne gas, a Xe gas and the like, in addition to the $N_2$ gas. At this time, in order to prevent the $O_2$ gas and the $H_2$ gas from being introduced into the first nozzle 233a, the valve 243d is opened to cause the $N_2$ gas to flow into the first inert gas supply pipe 232d. The $N_2$ gas is supplied into the process chamber 201 via the first gas supply pipe 232a and the first nozzle 233a and is exhausted from the exhaust pipe 231.

At this time, the APC valve 244 is appropriately regulated to set the internal pressure of the process chamber 201 to atmospheric pressure or less, for example, to fall within a range of, for example, 1 to 1000 Pa. The flow rate of the $O_2$ gas controlled by the MFC 241b is set to fall within a range of, for example, 1000 to 10000 sccm. The flow rate of the $H_2$ gas controlled by the MFC 241c is set to fall within a range of, for example, 1000 to 10000 sccm. The flow rates of the $N_2$ gas controlled by the MFCs 241d to 242f are set to fall within a range of, for example, 100 to 2000 sccm. A percentage concentration of the $H_2$ gas to the $O_2$ gas+the $H_2$ gas ($H_2/(O_2+H_2)$) is set to fall within a range of, for example, 2 20%. If the $H_2$ gas concentration (i.e., the percentage concentration of the $H_2$ gas to the $O_2$ gas+the $H_2$ gas) is less than 2%, the pre-treating effect is insufficient. If the $H_2$ gas concentration exceeds 20%, the pre-treating effect may be saturated. If the $H_2$ gas concentration is excessively high, a surface of the base Si is excessively oxidized. Accordingly, the $H_2$ gas concentration ($H_2/(O_2+H_2)$) may be set to fall within a range of 2 to 20%. In addition, the $H_2$ gas concentration ($H_2/(O_2+H_2)$) in the pre-treating process (Step S120) may be set to be a hydrogen concentration ($H_2/(O_2+H_2)$) or less in an $O_2+H_2$ supplying process (Step S133) of a silicon oxide film forming process (Step S130), which will be described later. A time period during which the $O_2$ gas and the $H_2$ gas are supplied to the wafers 200, that is, a gas supply time (an irradiation time), is set to fall within a range of, for example, 1 to 120 seconds, more specifically 30 to 60 seconds. If the gas supply time is less than one second, no pre-treating effect is produced. If the gas supply time is less than 30 seconds, the pre-treating effect is insufficient. If the gas supply time exceeds 60 seconds, the pre-treating effect may be saturated. If the gas supply time is excessively long, a surface of the base Si is excessively oxidized. Accordingly, the gas supply time may be set to fall within a range of 1 to 120 seconds, more specifically 30 to 60 seconds. In addition, the $O_2+H_2$ supply time in the pre-treating process (Step S120) may be set to be longer than the $O_2+H_2$ supply time in the $O_2+H_2$ supplying process (Step S133) in the silicon oxide film forming process (Step S130), which will be described later. A temperature of the heater 207 is set such that the temperature of the wafers 200 falls within a range of temperatures at which an effect of oxidizing power improvement, which will be described later, is remarkable, which is the same temperature range as in the HCDS gas supply of Step 131, for example, a range of, for example, 450 to 800 degrees C., more specifically 550 to 750 degrees C. It was confirmed that this temperature range provided a remarkable effect of oxidizing power improvement (described later) by the addition of the $H_2$ gas to the $O_2$ gas under a depressurized atmosphere. It was also confirmed that an excessively low temperature of the wafers 200 provided no effect of oxidizing power improvement.

When the $O_2$ gas and the $H_2$ gas are supplied into the process chamber 201 under the above conditions, the $O_2$ gas and the $H_2$ gas are thermally activated (excited) under non-plasma condition and react with each other under the heated and depressurized atmosphere, thereby generating an oxidation species containing oxygen such as atomic oxygen (O) but no water ($H_2O$). Oxidation processing of a surface of a silicon layer (i.e., base Si) on the surface of the wafer 200 is mainly performed by this oxidation species. Since energy of the oxidation species is higher than bonding energy of a bond of silicon and hydrogen or nitrogen (Si—H bond or Si—N bond) of the surface of the wafer 200 and a bond of silicon and an impurity or the like (Si—Cl bond, Si—C bond or the like) of the surface of the wafer 200, the Si—N, Si—Cl, Si—H and Si—C bonds are broken by applying the energy of the oxidation species to the silicon layer on the surface of the wafers 200. N, H, Cl and C debonded from Si are removed from the silicon layer and are discharged in the form of $N_2$, $H_2$, $Cl_2$, HCl, $CO_2$ and the like. Si bonds remaining after the debond from N, H, Cl and C are coupled with O contained in the oxidation species, thereby forming a Si—O bond. In this manner, the surface of the silicon layer on the surface of the wafers 200 is changed into a silicon oxide layer (SiO layer) having a small amount of impurities such as Cl. This oxidizing processing can significantly improve the oxidizing power as compared to a case where the $O_2$ gas is supplied alone and a case where a vapor ($H_2O$) is supplied. That is, by adding the $H_2$ gas to the $O_2$ gas under the depressurized atmosphere, the oxidizing power can be significantly improved as compared to the case where the $O_2$ gas is supplied alone and the case where the $H_2O$ gas is supplied.

At least one selected from a group consisting of the $O_2$ gas and the $H_2$ gas may be activated by plasma. By activating the $O_2$ gas and/or the $H_2$ gas by plasma, an oxidation species including an active species having higher energy can be generated and device characteristics can be improved by performing the oxidation process using this oxidation species. For example, in a case where both the $O_2$ gas and the $H_2$ gas are activated by plasma, by applying high-frequency power from the high-frequency power source 273 between the first rod-shaped electrode 269 and the second rod-shaped electrode 270 through the matcher 272, the mixture of the $O_2$ gas and the $H_2$ gas supplied into the buffer chamber 237 is activated (excited) by plasma. This activated mixture gas is supplied, as an active species-containing gas, i.e., a gas (oxidation species) containing $O_2^*$ (active species of oxygen) and $H_2^*$ (active species of hydrogen), from the gas supply holes 248c into the process chamber 201 and is exhausted from the exhaust pipe 231. At this time, the high-frequency power applied from the high-frequency power source 273 between the first rod-shaped electrode 269 and the second rod-shaped electrode 270 is set to fall within a range of, for example, 50 to 1000 W. The other process conditions are the same as the above-described process conditions. In the above-described temperature range, the $O_2$ gas and the $H_2$ gas are activated by heat to sufficiently react with each other, thereby generating an oxidation species containing sufficient atomic oxygen (O) but no $H_2O$. Therefore, even when the $O_2$ gas and the $H_2$ gas are thermally activated under a non-plasma condition, sufficient oxidizing power can be obtained. In addition, when the $O_2$ gas and the $H_2$ gas are activated by heat, it is possible to generate a relatively soft reaction without plasma damage so that the above-described oxidation process can be relatively softly performed.

As the oxygen-containing gas, i.e., the oxidizing gas, an ozone ($O_3$)) gas may be used instead of the $O_2$ gas. In addition, the effect of adding a hydrogen-containing gas to a nitrogen monoxide (NO) gas or a nitrous oxide ($N_2O$) gas in the above-described temperature range was tested and it was confirmed that the oxidizing power did not improve from supplying the NO gas or the $N_2O$ gas alone. That is, it was better in this instance to use an oxygen-containing gas that does not contain nitrogen (a gas containing oxygen but no nitrogen) as the oxygen-containing gas. As the hydrogen-containing gas, i.e., the reducing gas, a deuterium ($D_2$) gas may be used in addition to the $H_2$ gas. If an ammonia ($NH_3$) gas or a methane ($CH_4$) gas is used, impurities such as nitrogen (N) or carbon (C) may be introduced into the film. That is, it is better in this instance that a hydrogen-containing gas containing no other element (a gas containing hydrogen or deuterium but no other element) is used as the hydrogen-containing gas. That is, at least one gas selected from a group consisting of the $O_2$ gas and the $O_3$ gas can be used as the oxygen-containing gas and at least one gas selected from a group consisting of the $H_2$ gas and the $D_2$ gas can be used as the hydrogen-containing gas.

[Residual Gas Removal: Step S122]

After the SiO layer is formed by oxidizing the surface of the silicon layer on the surface of the wafer 200, the valve 243b of the second gas supply pipe 232b is closed to stop the supply of the $O_2$ gas. In addition, the valve 243c of the third gas supply pipe 232c is closed to stop the supply of the $H_2$ gas. At this time, with the APC valve 244 of the exhaust pipe 231 opened, the interior of the process chamber 201 is vacuum-exhausted by the vacuum pump 246 to remove residual $O_2$ gas or H2 gas and reaction byproducts from the process chamber 201 (residual gas removal). In addition, with the valves 243d to 243f opened, the supply of the $N_2$ gas serving as an inert gas into the process chamber 201 is maintained. The $N_2$ gas acts as a purge gas which is capable of further improving the effect of removing the unreacted $O_2$ gas or $H_2$ gas remaining in the process chamber 201 or the $O_2$ gas or $H_2$ gas which remains after contributing to the formation of the SiO layer from the process chamber 201.

At this time, the residual gas in the process chamber 201 may not be completely removed and the interior of the process chamber 201 may not be completely purged. If an amount of the residual gas in the process chamber 201 is minute, there is no adverse effect to be generated in Step S131 performed thereafter. In this case, an amount of the $N_2$ gas supplied into the process chamber 201 need not be a large amount. For example, approximately the same volume of the $N_2$ gas as the volume of the reaction tube 203 (the process chamber 201) may be supplied into the process chamber 201 to purge the interior of the process chamber 201 such that there is no adverse effect to be generated in Step S131. In this way, when the interior of the process chamber 201 is not completely purged, purge time can be shortened, thereby improving throughput. In addition, the consumption of the $N_2$ gas can be suppressed to a minimal necessity.

At this time, a temperature of the heater 207 is set such that the temperature of the wafer 200 falls within a range of, for example, 450 to 800 degrees C., more specifically 550 to 750 degrees C., as when the $O_2$ gas and the $H_2$ gas are supplied. A flow rate of the $N_2$ gas serving as a purge gas supplied from each inert gas supply system is set to fall within a range of, for example, 100 to 2000 sccm. Examples of the purge gas may include a rare gas such as an Ar gas, a He gas, a Ne gas, a Xe gas and the like, in addition to the $N_2$ gas.

(Silicon Oxide Film Forming Process: Step S130)

After performing the pre-treating to form the SiO layer by oxidizing the surface of the silicon layer on the surface of the wafer 200, a cycle including the following Steps S131 to S134 is performed a predetermined number of times (one or more times), in some instances a plurality of numbers of times (Step S135), to form a silicon oxide film having a predetermined film thickness on the SiO layer formed on the surface of the wafer 200.

[HCDS Gas Supply: Step S131]

The valve 243a of the first gas supply pipe 232a is opened to cause the HCDS gas to flow into the first gas supply pipe 232a. A flow rate of the HCDS gas flowing through the first gas supply pipe 232a is regulated by the MFC 241a. The HCDS gas with its flow rate regulated is supplied from the gas supply holes 248a of the first nozzle 233a into the buffer chamber 237 in a heated and depressurized state and is exhausted from the exhaust pipe 231. In this way, the HCDS gas is supplied to the wafer 200 (HCDS gas supply).

At this time, the valve 243d of the first inert gas supply pipe 232d is opened to cause the $N_2$ gas as an inert gas to flow from the first inert gas supply pipe 232d. A flow rate of the $N_2$ gas is regulated by the MFC 241b and the $N_2$ gas is supplied into the first gas supply pipe 232a. The $N_2$ gas with its flow rate regulated is mixed with the flow rate-regulated HCDS gas in the first gas supply pipe 232a. A mixture of the N₂ gas and the HCDS gas is supplied into the process chamber 201 in a heated and depressurized state and is exhausted from the exhaust pipe 231. At this time, in order to prevent the HCDS gas from being introduced into the buffer chamber 237 and the second nozzle 233b, the valves 243e and 243f are opened to cause the N₂ gas to flow into the second inert gas supply pipe 232e and the third inert gas supply pipe 232f. The N₂ gas is supplied into the process chamber 201 via the second gas supply pipe 232b, the third gas supply pipe 232c, the second nozzle 233b and the buffer chamber 237 and is exhausted from the exhaust pipe 231.

At this time, the APC valve 244 is appropriately regulated to set the internal pressure of the process chamber 201 to fall within a range of, for example, 1 to 13300 Pa, more specifically 10 to 1330 Pa. The flow rate of HCDS gas controlled by the MFC 241a is set to fall within a range of, for example, 1 to 1000 sccm. The flow rates of N₂ gases controlled by the MFCs 241d to 242f are set to fall within a range of, for example, 100 to 2000 sccm. A time period during which the HCDS gas is supplied to the wafers 200, that is, a gas supply time (an irradiation time), is set to fall within a range of, for example, 1 to 120 seconds, more specifically 30 to 60 seconds. At this time, a temperature of the heater 207 is set such that the temperature of the wafer 200 falls within a range of, for example, 350 to 800 degrees C., more specifically 450 to 800 degrees C., or further more specifically 550 to 750 degrees C.

If the temperature of the wafer 200 is less than 350 degrees C., the HCDS cannot be easily decomposed and adsorbed onto the wafer 200 such that a practical film forming rate cannot be obtained. This problem can be solved by setting the temperature of the wafer 200 to 350 to degrees C. or more to obtain a sufficient film forming rate. Also, by setting the temperature of the wafer 200 to 450 degrees C. or more, an effect of oxidizing power improvement in Step 133 to be described later becomes remarkable. Also, by setting the temperature of the wafer 200 to 550 degrees C. or more, the HCDS can be sufficiently decomposed.

If the temperature of the wafer 200 exceeds 750 degrees C., particularly 800 degrees C., a chemical vapor deposition (CVD) reaction is strengthened (a gaseous reaction becomes dominant), and thus film thickness uniformity may easily deteriorate to make it difficult to control the film thickness uniformity. It is possible to suppress the deterioration of the film thickness uniformity, and thus, control the film thickness uniformity by setting the temperature of the wafer 200 to 800 degrees C. or less. In particular, by setting the temperature of the wafer 200 to 750 degrees C. or less, the film thickness uniformity can be easily secured, and thus, it becomes easy to control the film thickness uniformity. Accordingly, the temperature of the wafer 200 may be set to fall within a range of 350 to 800 degrees C., more specifically 450 to 800 degrees C., or further more specifically 550 to 750 degrees C.

By supplying the HCDS gas to the wafer 200 under the above-described conditions, the silicon-containing layer having a thickness, for example, of less than one atomic layer to several atomic layers is formed on the SiO layer formed on the surface of the wafer 200. The silicon-containing layer may be an adsorption layer of the HCDS gas, a Si layer, or both of them. However, in some embodiments, the silicon-containing layer is a layer containing Si and Cl.

Here, the silicon layer is a generic name including a discontinuous layer as well as a continuous layer constituted by Si, or a silicon thin film formed by laminating the discontinuous layer and the continuous layer constituted by Si. Also, in some cases, a continuous layer constituted by Si may be referred to as a Si thin film. In addition, Si constituting the Si layer contains Si, in which bonding to Cl is not completely broken.

Moreover, the adsorption layer of the HCDS gas includes a chemisorption layer in which gas molecules of the HCDS gas are discontinuous, in addition to a chemisorption layer in which the gas molecules of the HCDS gas are continuous. That is, the adsorption layer of the HCDS gas includes a chemisorption layer having a thickness of one molecular layer containing HCDS molecules or less than one molecular layer. Further, HCDS (Si₂Cl₆) molecules constituting the adsorption layer of the HCDS gas also contain molecules in which bonding of Si and Cl is partially broken.

Also, a layer having a thickness of less than one atomic layer refers to a discontinuously formed atomic layer, and a layer having a thickness of one atomic layer refers to a continuously formed atomic layer. In addition, a layer having a thickness of less than one molecular layer refers to a discontinuously formed molecular layer, and a layer having a thickness of one molecular layer refers to a molecular layer that is continuously formed.

Under a condition in which the HCDS gas is autolyzed (pyrolyzed), i.e., under a condition in which a pyrolysis reaction of the HCDS gas occurs, Si is deposited on the wafer 200 to form the silicon layer. Under a condition in which the HCDS gas is not autolyzed (pyrolyzed), i.e., under a condition in which a pyrolysis reaction of the HCDS gas does not occur, the HCDS gas is adsorbed onto the wafer 200 to form the adsorption layer of the HCDS gas. In addition, a film-forming rate may be increased when the silicon layer is formed on the wafer 200, rather than when the adsorption layer of the HCDS gas is formed on the wafer 200.

When the thickness of the silicon-containing layer formed on the wafer 200 exceeds several atomic layers, an effect of oxidation (modification) in Step S133 described later is not applied to the entire silicon-containing layer. In addition, a minimum value of the thickness of the silicon-containing layer that can be formed on the wafer 200 is less than one atomic layer. Accordingly, the thickness of the silicon-containing layer may be less than one atomic layer to several atomic layers. In addition, as the thickness of the silicon-containing layer is one atomic layer or less, i.e., one atomic layer or less than one atomic layer, an effect of the oxidation (modification) reaction in Step S133 described later can be relatively increased, and thus a time required for the oxidation reaction in Step S133 can be reduced. A time for forming the silicon-containing layer in Step S131 can also be reduced. As a result, a processing time per one cycle can be reduced, and a total processing time can also be reduced. That is, the film forming rate can also be increased. In addition, as the thickness of the silicon-containing layer is one atomic layer or less, controllability of the film thickness uniformity can also be increased.

Examples of the precursor gas may include a tetrachlorosilane gas, i.e., a silicon tetrachloride (SiCl₄, abbreviation: STC) gas, a trichlorosilane (SiHCl₃, abbreviation: TCS) gas, a dichlorosilane (SiH₂Cl₂, abbreviation: DCS) gas, a monochlorosilane (SiH₃Cl, abbreviation: MCS) gas, and the like, in addition to the HCDS gas. Examples of the inert gas may include a rare gas such as an Ar gas, a He gas, a Ne gas, a Xe gas, and the like, in addition to the N2 gas.

[Residual Gas Removal: Step S132]

After the silicon-containing layer is formed on the wafer 200, the valve 243a of the first gas supply pipe 232a is closed to stop the supply of the HCDS gas. At this time, with the APC valve 244 of the exhaust pipe 231 is opened, the interior of the process chamber 201 is vacuum-exhausted by the vacuum pump 246 to remove an unreacted HCDS gas remaining in the process chamber 201 or a residual HCDS gas remaining after contributing to the formation of the silicon-containing layer from the process chamber 201 (residual gas removal). In addition, with the valves 243d to 243f opened, the supply of the $N_2$ gas serving as an inert gas into the process chamber 201 is maintained. The $N_2$ gas acts as a purge gas which is capable of further improving the effect of removing the unreacted HCDS gas remaining in the process chamber 201 or the residual HCDS gas remaining after contributing to the formation of the silicon-containing layer from the process chamber 201.

At this time, the residual gas in the process chamber 201 may not be completely removed and the interior of the process chamber 201 may not be completely purged. When the gas remaining in the process chamber 201 is very small in amount, there is no adverse effect generated in Step 133 performed thereafter. Here, an amount of the $N_2$ gas supplied into the process chamber 201 need not be a large amount, and for example, approximately the same amount of the $N_2$ gas as the reaction tube 203 (the process chamber 201) may be supplied to perform the purge such that there is no adverse effect generated in Step 133. As described above, as the interior of the process chamber 201 is not completely purged, the purge time can be reduced, thereby improving the throughput. In addition, the consumption of the $N_2$ gas can also be suppressed to a minimal necessity.

At this time, a temperature of the heater 207 is set such that the temperature of the wafer 200 falls within a range of, for example, 350 to 800 degrees C., more specifically 450 to 800 degrees C., or further more specifically 550 to 750 degrees C., as when the HCDS gas is supplied. A flow rate of the $N_2$ gas serving as a purge gas supplied from each inert gas supply system is set to fall within a range of, for example, 100 to 2000 sccm. Examples of the purge gas may include a rare gas such as an Ar gas, a He gas, a Ne gas, a Xe gas and the like, in addition to the $N_2$ gas.

[Supply of $O_2$ Gas and $H_2$ Gas: Step S133]

After removing the residual gas from the process chamber 201, the valve 243b of the second gas supply pipe 232b is opened to cause the $O_2$ gas to flow into the second gas supply pipe 232b. A flow rate of the $O_2$ gas flowing through the second gas supply pipe 232b is regulated by the MFC 241b. The $O_2$ gas with its flow rate regulated is supplied from the gas supply holes 248b of the second nozzle 233b into the buffer chamber 237 in a heated and depressurized state via the second gas supply pipe 232b. At the same time, the valve 243c of the third gas supply pipe 232c is opened to cause the $H_2$ gas to flow into the third gas supply pipe 232c. A flow rate of the $H_2$ gas flowing through the third gas supply pipe 232c is regulated by the MFC 241c. The $H_2$ gas with its flow rate regulated is supplied from the gas supply holes 248b of the second nozzle 233b into the buffer chamber 237 in a heated and depressurized state via the third gas supply pipe 232c. While flowing through the second gas supply pipe 232b, the $H_2$ gas is mixed with the $O_2$ gas in the second gas supply pipe 232b. That is, a mixture of the $O_2$ gas and the $H_2$ gas is supplied from the second nozzle 233b. The mixture of the $O_2$ gas and the $H_2$ gas supplied into the buffer chamber 237 is supplied from the gas supply holes 248c of the buffer chamber 237 into the process chamber 201 in a heated and depressurized state and is exhausted from the exhaust pipe 231. At this time, the $O_2$ gas and the $H_2$ gas are supplied to the wafers 200 (supply of $O_2$ gas and $H_2$ gas).

At this time, the valve 243e of the second inert gas supply pipe 232e is opened to cause the $N_2$ gas serving as an inert gas to flow from the second inert gas supply pipe 232e. A flow rate of the $N_2$ gas is regulated by the MFC 241e and the $N_2$ gas is supplied into the second gas supply pipe 232b. In addition, the valve 243f of the third inert gas supply pipe 232f is opened to cause the $N_2$ gas as an inert gas to flow from the third inert gas supply pipe 232f. A flow rate of the $N_2$ gas is regulated by the MFC 241f and the $N_2$ gas with its flow rate regulated is supplied into the third gas supply pipe 232c. A mixture of the $O_2$ gas, the $H_2$ gas and the $N_2$ gas is supplied from the second nozzle 233b. Examples of the inert gas may include a rare gas such as an Ar gas, a He gas, a Ne gas, a Xe gas and the like, in addition to the $N_2$ gas. At this time, in order to prevent the $O_2$ gas and the $H_2$ gas from being introduced into the first nozzle 233a, the valve 243d is opened to cause the $N_2$ gas to flow into the first inert gas supply pipe 232d. The $N_2$ gas is supplied into the process chamber 201 via the first gas supply pipe 232a and the first nozzle 233a and is exhausted from the exhaust pipe 231.

At this time, the APC valve 244 is appropriately regulated to set the internal pressure of the process chamber 201 to atmospheric pressure or less, for example, to fall within a range of, for example, 1 to 1000 Pa. The flow rate of the $O_2$ gas controlled by the MFC 241b is set to fall within a range of, for example, 1000 to 10000 sccm. The flow rate of the $H_2$ gas controlled by the MFC 241c is set to fall within a range of, for example, 1000 to 10000 sccm. The flow rates of $N_2$ gases controlled by the MFCs 241d to 242f are set to fall within a range of, for example, 100 to 2000 sccm. A percentage concentration of the $H_2$ gas to the $O_2$ gas+the $H_2$ gas ($H_2/(O_2+H_2)$) is set to fall within a range of, for example, 10 to 30%. A time period during which the $O_2$ gas and the $H_2$ gas are supplied to the wafers 200, that is, a gas supply time (an irradiation time), is set to fall within a range of, for example, 1 to 60 seconds, more specifically 1 to 30 seconds, or further more specifically 1 to 20 seconds. A temperature of the heater 207 is set such that the temperature of the wafer 200 falls within a range of temperature at which an effect of oxidizing power improvement, which will be described later, is remarkable, which is the same temperature range as in the HCDS gas supply of Step 131, for example, a range of, for example, 450 to 800 degrees C., more specifically 550 to 750 degrees C. It was confirmed that this temperature range provided a remarkable effect of oxidizing power improvement (described later) by the addition of the $H_2$ gas to the $O_2$ gas under the depressurized atmosphere. It was also confirmed that an excessively low temperature of the wafer 200 provided no effect of oxidizing power improvement. In consideration of throughput, the temperature of the heater 207 may be set such that the internal temperature of the process chamber 201 can be maintained at the same temperature range for Steps S131 to S134 (described later). In this case, the temperature of the heater 207 is set such that the internal temperature of the process chamber 201 is set to a constant temperature within a range of, for example, 450 to 800 degrees C., more specifically 550 to 750 degrees C. for Steps S131 to S134 (described later). Also, the temperature of the heater 207 may be set such that the internal temperature of the process chamber 201 can be maintained at the same temperature range for Steps S120 to S130.

When the $O_2$ gas and the $H_2$ gas are supplied into the process chamber 201 under the above conditions, the $O_2$ gas and the $H_2$ gas are thermally activated (excited) under a non-plasma condition and react with each other under the heated and depressurized atmosphere, thereby generating an oxidation species containing oxygen such as atomic oxygen (O) but no water ($H_2O$). Oxidation processing of the silicon-containing layer formed on the wafer 200 in Step S131 is mainly performed by this oxidation species. Since energy of the oxidation species is higher than bonding energy of Si—N, Si—Cl, Si—H or Si—C contained in the silicon-containing layer, the Si—N, Si—Cl, Si—H and Si—C bonds are broken by applying the energy of the oxidation species to the silicon-containing layer. N, H, Cl and C debonded from Si are removed from the silicon-containing layer and are discharged in the form of $N_2$, $H_2$, $Cl_2$, HCl, $CO_2$ and the like. Si bonds remaining after the debond from N, H, Cl and C are coupled with O contained in the oxidation species, thereby forming a Si—O bond. In this manner, the silicon-containing layer is changed (modified) into a silicon oxide ($SiO_2$) layer (hereinafter referred simply to as a SiO layer) having a small amount of impurities such as Cl. This oxidizing processing can significantly improve the oxidizing power as compared to a case where the $O_2$ gas is supplied alone and a case where a vapor ($H_2O$) is supplied. That is, by adding the $H_2$ gas to the $O_2$ gas under the depressurized atmosphere, the oxidizing power can be significantly improved as compared to the case where the $O_2$ gas is supplied alone and the case where the $H_2O$ gas is supplied.

At least one selected from a group consisting of the $O_2$ gas and the $H_2$ gas may be activated by plasma in Step S133. By activating the $O_2$ gas and/or the $H_2$ gas by plasma, an oxidation species including an active species having higher energy can be generated and device characteristics can be improved by performing oxidation process using this oxidation species. For example, in a case where both of the $O_2$ gas and the $H_2$ gas are activated by plasma, by applying high-frequency power from the high-frequency power source 273 between the first rod-shaped electrode 269 and the second rod-shaped electrode 270 through the matcher 272, the mixture of the $O_2$ gas and the $H_2$ gas supplied into the buffer chamber 237 is activated (excited) by plasma. This activated mixture gas is supplied, as an active species-containing gas, i.e., a gas (oxidation species) containing $O_2$* (active species of oxygen) and $H_2$* (active species of hydrogen), from the gas supply holes 248c into the process chamber 201 and is exhausted from the exhaust pipe 231. At this time, the high-frequency power applied from the high-frequency power source 273 between the first rod-shaped electrode 269 and the second rod-shaped electrode 270 is set to fall within a range of, for example, 50 to 1000 W. Other process conditions are the same as the above-described process conditions. In the above-described temperature range, the $O_2$ gas and the $H_2$ gas are activated by heat to sufficiently react with each other, thereby generating an oxidation species containing sufficient atomic oxygen (O) but no $H_2O$. Therefore, even when the $O_2$ gas and the $H_2$ gas are thermally activated under non-plasma conditions, sufficient oxidizing power can be obtained. In addition, when the $O_2$ gas and the $H_2$ gas are activated by heat, it is possible to generate a relatively soft reaction without plasma damage so that the above-described oxidation process can be relatively softly performed.

As the oxygen-containing gas, i.e., the oxidizing gas, an ozone ($O_3$) gas may be used instead of the $O_2$ gas. In addition, an effect of addition of a hydrogen-containing gas to a nitrogen monoxide (NO) gas or a nitrous oxide ($N_2O$) gas in the above-described temperature range was tested and it was confirmed that an effect of oxidizing power improvement over supply of the NO gas or the $N_2O$ gas alone was not obtained. That is, it is preferable in some embodiments that an oxygen-containing gas that does not contain nitrogen (a gas containing oxygen but no nitrogen) is used as the oxygen-containing gas. As the hydrogen-containing gas, i.e., the reducing gas, a deuterium ($D_2$) gas may be used in addition to the $H_2$ gas. If an ammonia ($NH_3$) gas or a methane ($CH_4$) gas is used, impurities such as nitrogen (N) impurity or carbon (C) may be introduced into the film. That is, it is preferable in some embodiments that a hydrogen-containing gas containing no other element (a gas containing hydrogen or deuterium but no other element) is used as the hydrogen-containing gas. That is, at least one gas selected from a group consisting of the $O_2$ gas and the $O_3$ gas can be used as the oxygen-containing gas and at least one gas selected from a group consisting of the $H_2$ gas and the $D_2$ gas can be used as the hydrogen-containing gas.

[Residual Gas Removal: Step S134]

After the silicon-containing gas is changed into the SiO layer, the valve 243b of the second gas supply pipe 232b is closed to stop the supply of the $O_2$ gas. In addition, the valve 243c of the third gas supply pipe 232c is closed to stop the supply of the $H_2$ gas. At this time, with the APC valve 244 of the exhaust pipe 231 opened, the interior of the process chamber 201 is vacuum-exhausted by the vacuum pump 246 to remove residual $O_2$ gas or H2 gas and reaction byproducts from the process chamber 201 (residual gas removal). In addition, with the valves 243d to 243f opened, the supply of the $N_2$ gas serving as an inert gas into the process chamber 201 is maintained. The $N_2$ gas acts as a purge gas which is capable of further improving the effect of removing the unreacted $O_2$ gas or $H_2$ gas remaining in the process chamber 201 or the $O_2$ gas or $H_2$ gas which remains after contributing to the formation of the SiO layer from the process chamber 201.

At this time, the residual gas in the process chamber 201 may not be completely removed and the interior of the process chamber 201 may not be completely purged. If an amount of the residual gas in the process chamber 201 is minute, there is no adverse effect to be generated in Step S131 performed thereafter. In this case, an amount of the $N_2$ gas supplied into the process chamber 201 need not be a large amount. For example, approximately the same volume of the $N_2$ gas as the volume of the reaction tube 203 (the process chamber 201) may be supplied into the process chamber 201 to purge the interior of the process chamber 201 such that there is no adverse effect to be generated in Step S131. In this way, when the interior of the process chamber 201 is not completely purged, purge time can be shortened, thereby improving throughput. In addition, the consumption of the $N_2$ gas can be suppressed to a minimal necessity.

At this time, a temperature of the heater 207 is set such that the temperature of the wafer 200 falls within a range of, for example, 450 to 800 degrees C., more specifically 550 to 750 degrees C., as when the $O_2$ gas and the $H_2$ gas are supplied. A flow rate of the $N_2$ gas serving as a purge gas supplied from each inert gas supply system is set to fall within a range of, for example, 100 to 2000 sccm. Examples of the purge gas may include a rare gas such as an Ar gas, a He gas, a Ne gas, a Xe gas and the like, in addition to the $N_2$ gas.

(Performing Predetermined Number of Times)

A cycle in which the above-described Steps S131 to S134 are performed may be set as one cycle and the cycle may be performed a predetermined number of times, e.g., one or more times (Step S135), to form a silicon oxide ($SiO_2$) film (hereinafter, simply referred to as a SiO film) having a predetermined film thickness on the SiO layer formed on the surface of the wafers 200.

In addition, when the cycle is performed a plurality of times, the phase "supplying a predetermined gas to the wafer 200" in each step after at least two cycles means "supplying a predetermined gas to a layer formed on the wafer 200, i.e., to an outermost surface of the wafer 200, which is a laminated body." The phrase "forming a layer on the wafer 200" means "forming a layer on a layer formed on the wafer 200, i.e., on an outermost surface of the wafer 200, which is a laminated body." These are the same as the above-described matters.

(Purge and Return to Atmospheric Pressure: Steps S104 and S105)

Once the SiO film having the predetermined film thickness is formed, the valves 243d to 243f are opened to cause the $N_2$ gas serving as an inert gas to flow from each of the inert gas supply pipes 232d to 232f into the process chamber 201 and the $N_2$ gas is exhausted from the exhaust pipe 231. The $N_2$ gas acts as a purge gas such that the interior of the process chamber 201 is purged with the inert gas, thereby removing a gas remaining in the process chamber 201 from the process chamber 201 (purge: Step S104). Thereafter, the internal atmosphere of the process chamber 201 is substituted with the inert gas and the internal pressure of the process chamber 201 returns to atmospheric pressure (return to atmospheric pressure: Step 105).

(Boat Unload and Wafer Discharge: Steps S106 and S107)

Thereafter, the seal cap 219 is descended by the boat elevator 115 to open the bottom of the manifold 209, and the processed wafers 200 supported by the boat 217 is unloaded to the outside of the reaction tube 203 through the bottom of the manifold 209 (boat unload: Step S106). After the boat 217 is unloaded, the shutter 219s is moved by the shutter opening/closing mechanism 115s such that the bottom opening of the manifold 209 is sealed by the shutter 219s through the O-ring 220c (shutter close). Thereafter, the processed wafers 200 are discharged out of the boat 217 (wafer discharge: Step S107).

Other Embodiments

Hereinabove, the specific embodiment of the present disclosure have been specifically described, but the present disclosure is not limited to the above-described embodiment, and may be variously modified without departing from the spirit of the present disclosure.

For example, although it has been illustrated in the above embodiment that the substrate processing apparatus includes the plasma source and the buffer chamber 237, the present disclosure is not limited to the above embodiment. That is, no plasma source and buffer chamber may be installed. This configuration allows the structure of the substrate processing apparatus to be simplified to reduce production costs. In addition, although it has been illustrated that the $O_2$ gas and the $H_2$ gas are supplied from the same nozzle into the process chamber 201, the HCDS gas and the $H_2$ gas may be supplied from the same nozzle into the process chamber 201. In this case, a leading end portion of the third gas supply pipe 232c may be connected to a downstream side of the valve 243a of the first gas supply pipe 232a.

In addition, for example, although it has been illustrated in the above embodiment that, when the silicon-containing layer is formed in Step S131, the chlorosilane-based precursor gas is used as the precursor gas, the chlorosilane-based precursor gas may be replaced with a silane-based precursor gas having halogen-based ligands other than chloro groups. For example, the chlorosilane-based precursor gas may be replaced with a fluorosilane-based precursor gas. Here, the fluorosilane-based precursor gas refers to a gaseous fluorosilane-based precursor gas (for example, a fluorosilane-based precursor in a gas state under the room temperature and atmospheric pressure, a gas obtained by vaporizing a fluorosilane-based precursor in a liquid state under room temperature and atmospheric pressure, etc.). In addition, the fluorosilane-based precursor refers to a silane-based precursor having a fluoro group as a halogen group, containing at least silicon (Si) and fluorine (F). That is, the fluorosilane-based precursor may refer to a kind of halide. Examples of the fluorosilane-based precursor gas may include a silicon fluoride gas such as a tetrafluorosilane (or silicon tetrafluoride ($SiF_4$)) gas, a hexafluorosilane ($Si_2F_6$) gas or the like. In this case, the fluorosilane-based precursor gas is supplied to the wafer 200 in the process chamber 201 to form the silicon-containing layer. The silicon-containing gas formed thus may include a silicon fluoride gas adsorption layer, a Si layer, or both.

In addition, although it has been illustrated in the above embodiment that, in Step S133 of the silicon oxide film forming process, the silicon-containing layer is changed into the silicon oxide layer by supplying the $O_2$ gas and the $H_2$ gas as the reaction gases into the process chamber 201 under a heated and depressurized pressure atmosphere, the present disclosure is not limited thereto. That is, in Step S133 of the silicon oxide film forming process, an oxygen-containing gas such as an $O_2$ gas, an $O_3$ gas or a $H_2O$ gas may be supplied as a reaction gas without supplying the $H_2$ gas. In addition, this oxygen-containing gas may be activated by plasma, and then supplied.

In addition, although it has been illustrated in the above embodiment that the HCDS gas serving as the precursor gas and the $O_2$ gas and the $H_2$ gas serving as the reaction gases are alternately supplied into the process chamber 201 in the silicon oxide film forming process, the present disclosure is not limited thereto. That is, in the silicon oxide film forming process, the HCDS gas serving as the precursor gas and an oxygen-containing gas such as an $O_2$ gas, an $O_3$ gas or a $H_2O$ gas serving as a reaction gas may be simultaneously supplied into the process chamber 201.

In addition, although it has been illustrated in the above embodiment that the HCDS gas serving as the precursor gas and the $O_2$ gas and the $H_2$ gas serving as the reaction gases are used to form the SiO film as a thin film on the wafers, the present disclosure is not limited thereto. For example, an aminosilane-based precursor gas may be used as the precursor gas, in addition to the chlorosilane-based gas such as the HCDS gas. For example, an organic precursor gas such as an aminosilane-based gas, including a tetrakis(dimethylamino)silane ($Si[N(CH_3)_2]_4$, abbreviation: 4DMAS) gas, a tris(dimethylamino)silane ($Si[N(CH_3)_2]_3H$, abbreviation: 3DMAS) gas, a bis(diethylamino)silane ($Si[N(C_2H_5)_2]_2H_2$, abbreviation: 2DEAS) gas, a bis(tertiary-butylamino)silane ($SiH_2[NH(C_4H_9)]_2$, abbreviation: BTBAS) gas, a hexamethyldisilazane (($CH_3)_3Si$—NH—$Si(CH_3)_3$, abbreviation: HMDS) gas and the like may be used. As the reaction gas, a nitriding gas (nitrogen-containing gas) such as an $NH_3$ gas, a carbon-containing gas such as a $C_3H_6$ gas or a boron-containing gas such as a $BCl_3$ gas may be used instead of the $O_2$ gas and the $H_2$ gas. The above-mentioned various reaction gases may be appropriately used to form a SiN film, a SiON film, a SiCN film, a SiOCN film, a SiOC film, a SiBCN film, a SiBN film or the like, as a thin film, in addition to the SiO film. These reaction gases may also be applied to a case where a laminate of the SiN film and the SiO film, for example, a laminated film such as an ON film, a NO film, an ONO film, an ONONO film, a NONON film or the like, is formed.

In addition, although it has been illustrated in the above embodiment that the silicon-based film containing silicon, which is a semiconductor element, is formed as the thin film, the present disclosure is not limited thereto. That is, the present disclosure may be suitably applied to a case where a metal-based film containing metal elements such as, for example, titanium (Ti), zirconium (Zr), hafnium (Hf), tantalum (Ta), aluminum (Al), molybdenum (Mo) and the like is formed.

For example, in a case where a titanium oxide (TiO) film is formed as a metal-based film containing Ti, a gas containing Ti and a chloro group such as a titanium tetrachloride ($TiCl_4$) gas or a gas containing Ti and a fluoro group such as a titanium tetrafluoride ($TiF_4$) gas may be used as the precursor gas. As the reaction gas, the same gas as the above embodiment may be used. The process conditions at this time may be the same as those of the above embodiment.

In addition, for example, in a case where a zirconium oxide (ZrO) film is formed as a metal-based film containing Zr, a gas containing Zr and a chloro group such as a zirconium tetrachloride ($ZrCl_4$) gas or a gas containing Zr and a fluoro group such as a zirconium tetrafluoride ($ZrF_4$) gas may be used as the precursor gas. As the reaction gas, the same gas as the above embodiment may be used. The process conditions at this time may be the same as those of the above embodiment.

In addition, for example, in a case where a hafnium oxide (HfO) film is formed as a metal-based film containing Hf, a gas containing Hf and a chloro group such as a hafnium tetrachloride ($HfCl_4$) gas or a gas containing Hf and a fluoro group such as a hafnium tetrafluoride ($HfF_4$) gas may be used as the precursor gas. As the reaction gas, the same gas as the above embodiment may be used. The process conditions at this time may be the same as those of the above embodiment.

In addition, for example, in a case where a tantalum oxide (TaO) film is formed as a metal-based film containing Ta, a gas containing Ta and a chloro group such as a tantalum pentachloride ($TaCl_5$) gas or a gas containing Ta and a fluoro group such as a tantalum pentafluoride ($TaF_5$) gas may be used as the precursor gas. As the reaction gas, the same gas as the above embodiment may be used. The process conditions at this time may be the same as those of the above embodiment.

In addition, for example, in a case where an aluminum oxide (AlO) film is formed as a metal-based film containing Al, a gas containing Al and a chloro group such as an aluminum trichloride ($AlCl_3$) gas or a gas containing Al and a fluoro group such as an aluminum trifluoride ($AlF_3$) gas may be used as the precursor gas. As the reaction gas, the same gas as the above embodiment may be used. The process conditions at this time may be the same as those of the above embodiment.

In addition, for example, in a case where a molybdenum oxide (MoO) film is formed as a metal-based film containing Mo, a gas containing Mo and a chloro group such as a molybdenum pentachloride ($MoCl_5$) gas or a gas containing Mo and a fluoro group such as a molybdenum pentafluoride ($MoF_5$) gas may be used as the precursor gas. As the reaction gas, the same gas as the above embodiment may be used. The process conditions at this time may be the same as those of the above embodiment.

As described above, the present disclosure may be applied to the metal-based film as well as the silicon-based film, in which case the same operation and effects as the above embodiment may be obtained.

In addition, although it has been described in the above embodiment that the batch type substrate processing apparatus to process a plurality of substrates at once is used to form the film, the present disclosure is not limited thereto but may be suitably applied to film formation using a single wafer type substrate processing apparatus to process a single substrate or several substrates at once. In addition, although it has been illustrated in the above embodiment that the substrate processing apparatus including the hot wall type processing furnace is used to form the film, the present disclosure is not limited thereto but may be suitably applied to a case where a substrate processing apparatus including a cold wall type processing furnace is used to form the film.

In addition, the above embodiments, modifications and applications may be used in proper combinations.

In addition, the present disclosure may be implemented, for example by changing process recipes of an existing substrate processing apparatus. The change of process recipes may include installing the process recipes of the present disclosure in the existing substrate processing apparatus via a telecommunication line or a recording medium storing the process recipes, and operating an input/output device of the existing substrate processing apparatus to change its process recipes into the process recipes of the present disclosure.

Examples

As a conventional method, the substrate processing apparatus of the above embodiment was used to form a SiO film (Step S130), without performing the pre-treating (Step S120) in the film forming sequence of the above embodiment, on a mono-crystalline silicon wafer (hereinafter referred to as a bare wafer) with its surface exposed or a wafer having a poly-crystalline silicon film (hereinafter referred to as a poly-Si film) formed thereon. As a method of the present disclosure, the substrate processing apparatus of the above embodiment was used to perform the pre-treating (Step S120) for a bare wafer with its surface exposed or a wafer having a poly-Si film formed thereon and then form a SiO film (Step S130), according to the film forming sequence of the above embodiment. Here, the mono-crystalline silicon wafer and the poly-Si film serving as a base of film formation of the SiO film are simply referred to as a base Si. An HCDS gas, an $O_2$ gas and a $H_2$ gas were used as a precursor gas, an oxygen-containing gas and a hydrogen-containing gas, respectively. The process conditions in each step were the same process conditions as the above embodiment. Then, various characteristics of the respective SiO films were evaluated.

FIG. 7 is a view illustrating an in-plane film thickness distribution and an in-plane film thickness uniformity of the SiO films formed on bare wafers according to the method of the present disclosure and the conventional method. In the figure, the term "thin film condition" represents a case where an oxide film having a film thickness of 100 Å or less is formed and the term "thick film condition" represents a case where an oxide film having a film thickness exceeding 100 Å is formed. In the figure, "TOP," "CNT" and "BTM" represent top, center and bottom positions, respectively, of the wafers accommodated in the boat and measured in terms of film thickness. In addition, the in-plane film thickness uniformity was calculated according to the following Equation 1 using the maximum and minimum values of the in-plane film thickness of the SiO films in the wafers, i.e., the in-plane maximum film thickness and the in-plane minimum film thickness, and the average value of the in-plane film thicknesses of the SiO films in the wafers, i.e., the in-plane average film thickness. That is, the in-plane film thickness uniformity represents a variation of the in-plane film thickness of the SiO films in the wafers. A smaller value means a smaller variation (more uniformity). The film thickness of the SiO films was measured by an ellipsometer. This is true of the following other examples.

In-plane film thickness uniformity=[(in-plane maximum film thickness−in-plane minimum film thickness)/(in-plane average film thickness×2)]×100(±%)        Equation 1

It can be seen from FIG. 7 that, in the case where an oxide film having a film thickness of 100 Å or less is formed (the thin film conditions), the method of the present disclosure provides remarkable improvement of the in-plane film thickness uniformity over the conventional method. It can also be seen that, in the case where an oxide film having a film thickness exceeding 100 Å is formed (the thick film conditions), the method of the present disclosure provides improvement of the in-plane film thickness uniformity over the conventional method.

Figure 8:
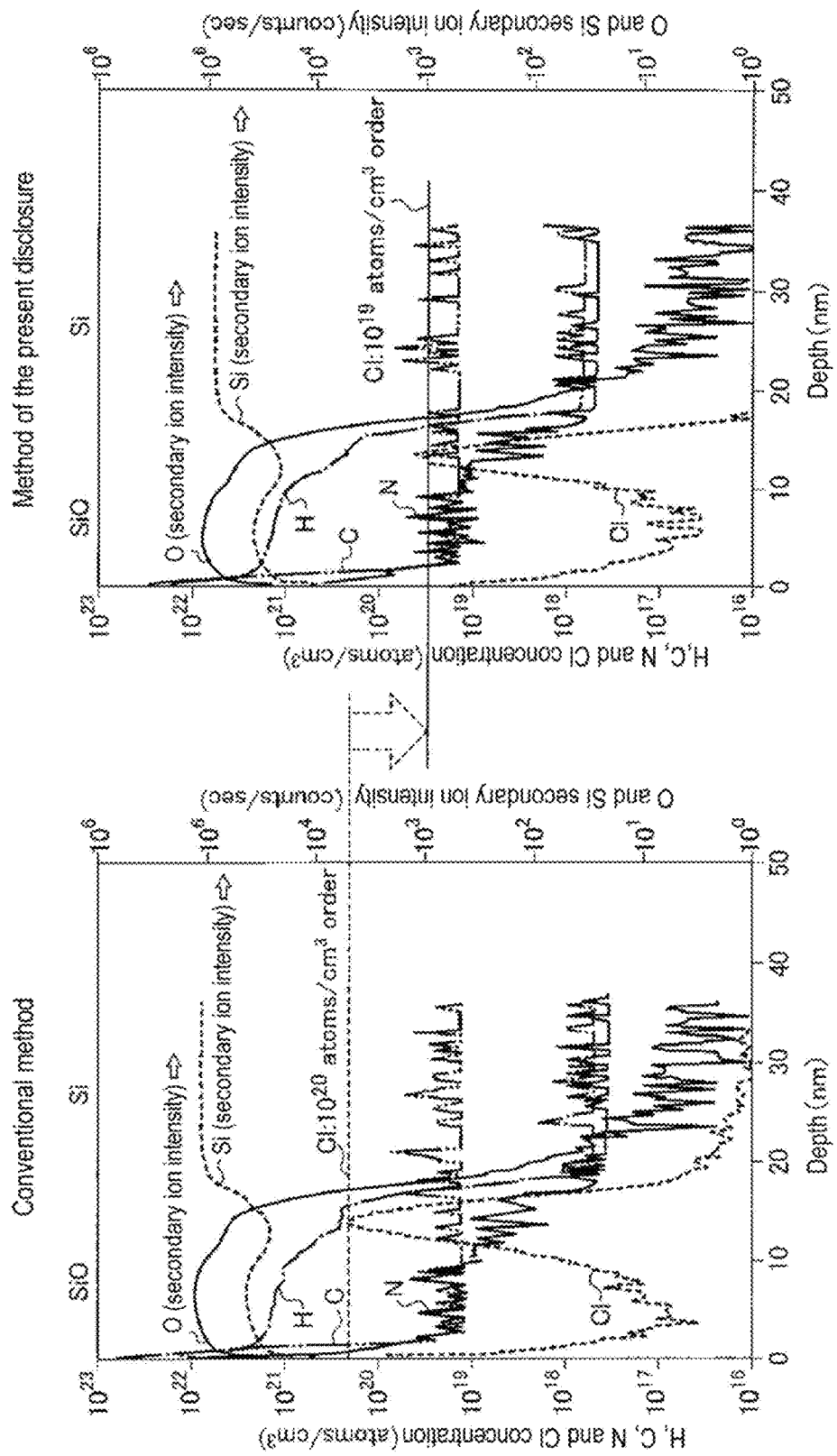
FIG. 8 is a view illustrating a Cl concentration of an interface between the SiO film and base Si.

FIG. 8 is a view illustrating a H concentration, a C concentration, a N concentration, a Cl concentration, and the like, at an interface between the SiO films formed on the bare wafers and the base Si according to the method of the present disclosure and the conventional method. The results shown in FIG. 8 are measured by secondary ion mass spectrometry (SIMS). In FIG. 8, a horizontal axis represents a depth (nm) from the surface of the SiO film, a left vertical axis represents a concentration (atoms/cm$^3$) of H, C, N and Cl and a right vertical axis represents a secondary ion intensity (counts/sec) of O and Si.

It can be seen from FIG. 8 that the Cl concentration at the interface between the SiO film formed according to the conventional method and the base Si is $10^{20}$ atoms/cm$^3$ and the Cl concentration at the interface between the SiO film formed according to the method of the present disclosure and the base Si is $10^{19}$ atoms/cm$^3$. The method of the present disclosure provides an interface Cl concentration which is lower by one factor than that of the conventional method. That is, it can be seen that the method of the present disclosure performing the pre-treating can significantly reduce a residual Cl concentration over the conventional method performing no pre-treating.

Figure 9:
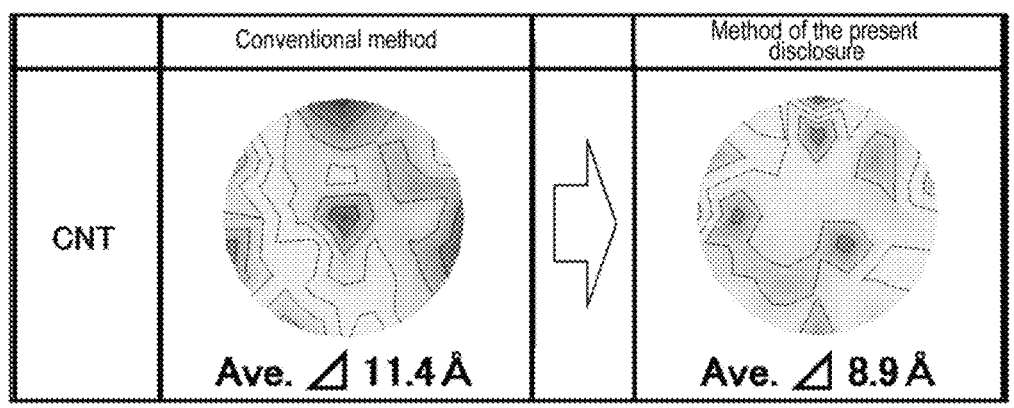
FIG. 9 is a view illustrating an amount of oxidation of the base Si.

FIG. 9 illustrates results of measurement on an amount of oxidation of the base Si when the SiO film is formed on the poly-Si film according to the method of the present disclosure and the conventional method. In addition, the amount of oxidation of the base Si was obtained by a difference between T1 and T2 (i.e., T1-T2) where T1 is an in-plane film thickness measured at measurement points on the poly-Si film on which the SiO film is formed, and T2 is an in-plane film thickness measured at measurement points on the poly-Si film left after the SiO film is removed by a dilute hydrofluoric acid (DHF). Numerical values in the figure represent an average of differences at the measurement points and an in-plane distribution diagram represents a distribution of the differences.

It can be seen from FIG. 9 that the amount of oxidation of the base Si when the SiO film is formed according to the conventional method is 11.4 Å in average and the amount of oxidation of the base Si when the SiO film is formed according to the method of the present disclosure is 8.9 Å in average, i.e., the method of the present disclosure performing the pre-treating can reduce the amount of oxidation of the base Si over the conventional method performing no pre-treating.

Figure 10:
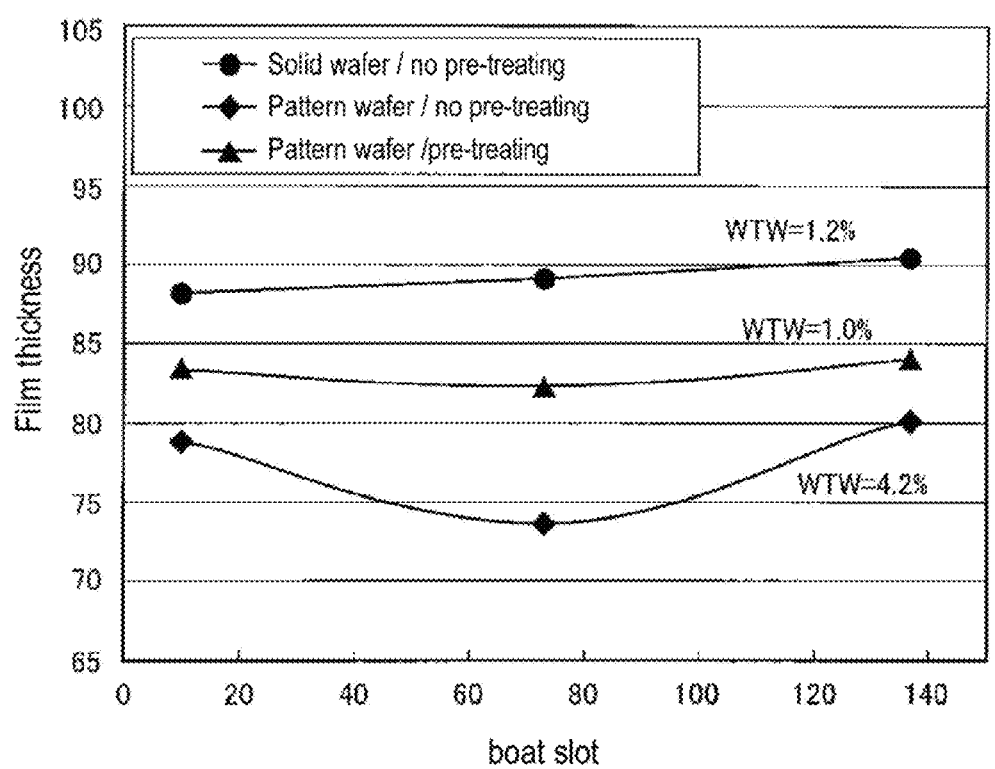
FIG. 10 is a view illustrating a relationship between a wafer loading position and a film thickness of the SiO film.

FIG. 10 is a view illustrating a relationship between a wafer loading position on a boat (boat slot) and a SiO film thickness when a wafer having a flat surface (having no unevenness) (hereinafter referred to as a solid wafer) and a wafer having an uneven surface (hereinafter referred to as a pattern wafer) are used to form the SiO film according to the method of the present disclosure and the conventional method. In the figure, the term "no pre-treating" represents a case where the film is formed according to the conventional method and the term "pre-treating" represents a case where the film is formed according to the method of the present disclosure.

It can be seen from FIG. 10 that the use of the solid wafer shows little loading effect, while the use of the pattern wafer shows reduced entire film thickness, particularly remarkably reduced film thickness near CNT, showing deteriorated wafer-to-wafer (WTW) uniformity. In contrast, it can be seen that, even in the case of using the pattern wafer, this deterioration can be alleviated when the pro-processing is performed for the pattern wafer. Here, a loading effect refers to an effect that film thickness and film thickness uniformity are varied depending on a base (surface area and the like) of film formation.

Figure 11:
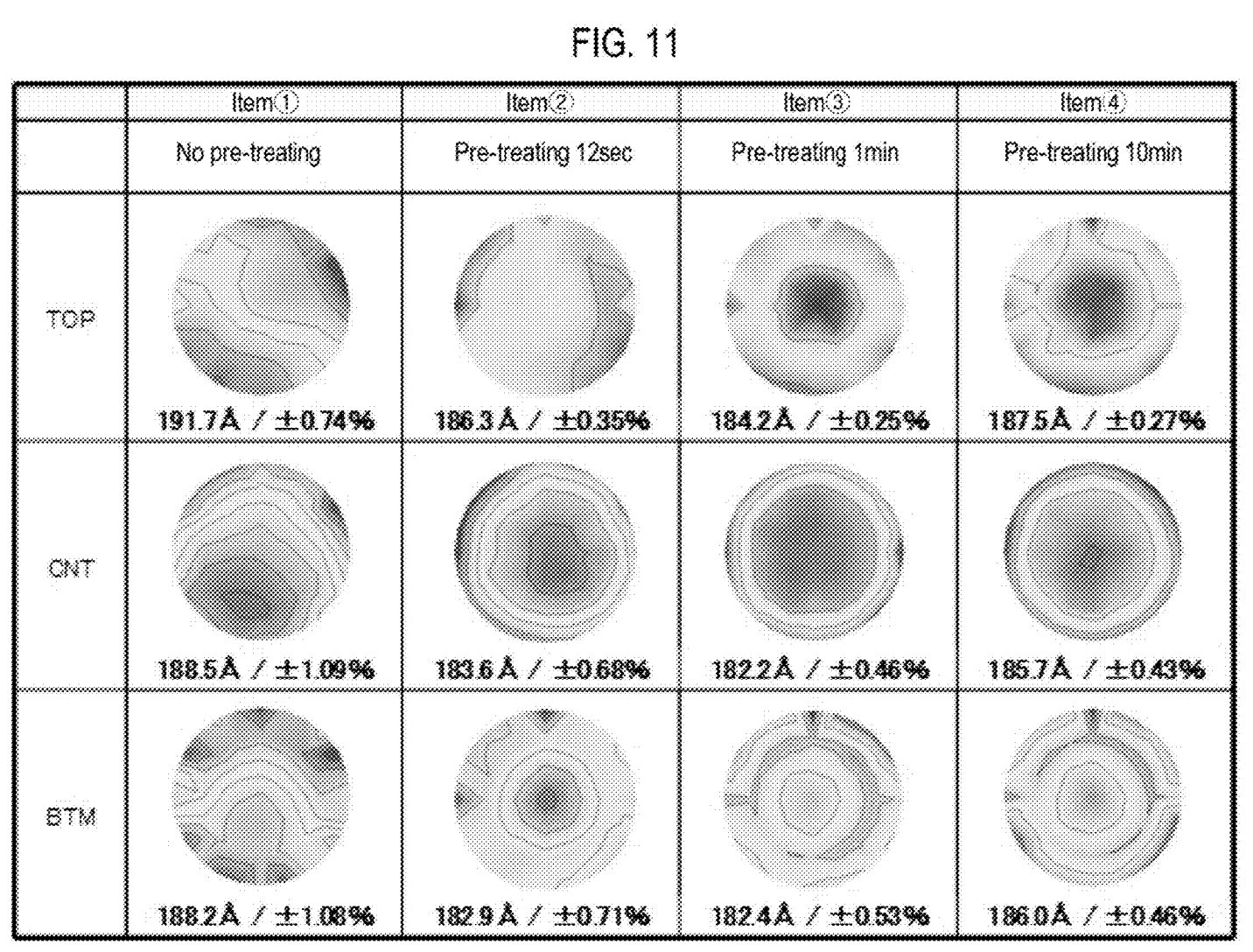

FIG. 11 is a view illustrating a relationship between a pre-treating time, a wafer in-plane distribution of the film thickness of the SiO film, an average film thickness and a wafer in-plane film thickness uniformity when the SiO film is formed on a bare wafer according to the method of the present disclosure and the conventional method. Numerical values in the figure represent the average film thickness or the wafer in-plane film thickness uniformity of the SiO film. In the figure, the term "no pre-treating" represents a case where the film is formed according to the conventional method, i.e., a case where the pre-treating time is 0 sec, and the term "pre-treating" represents a case where the film is formed according to the method of the present disclosure. "TOP," "CNT" and "BTM" are as described above and a method of measuring the film thickness of the SiO film and a method of calculating the in-plane film thickness uniformity are also as described above.

It can be seen from FIG. 11 that, by performing the pre-treating, the wafer in-plane distribution of the film thickness of the SiO film tends to have an ideal concentric circle shape. In addition, it can be seen that longer pre-treating time provides better in-plane film thickness uniformity of the SiO film and the effect of improvement of the in-plane film thickness uniformity is saturated with a lapse of a certain pre-treating time, for example, one minute (60 sec).

FIG. 12 is a graph illustrating a correlation between the pre-treating time and an amount of oxidation of the base Si (poly-Si film) when the SiO film is formed on a wafer on which the poly-Si film is formed. In FIG. 12, a horizontal axis represents the pre-treating time (sec) and a vertical axis represents poly depletion, i.e., the amount of oxidation of the base Si (poly-Si film). The amount of oxidation of the base Si was obtained as described above. FIG. 12 shows a case where a hydrogen concentration ($H_2/(O_2+H_2)$) when performing the pre-treating and a hydrogen concentration when forming the oxide film are both 18% (18% pre-treating+18% Depo) and a case where the hydrogen concentration when performing the pre-treating is 3% and the hydrogen concentration when forming the oxide film is 18% (3% pre-treating+18% Depo).

It can be seen from FIG. 12 that, in both cases, the oxidation of the base Si can be suppressed (see FIG. 9). It can also be seen that, instead of setting the hydrogen concentration when performing the pre-treating to be equal to the hydrogen concentration when forming the oxide film, setting the hydrogen concentration when performing the pre-treating to be smaller than the hydrogen concentration when forming the oxide film can more effectively suppress the oxidation of the base Si more.

<Aspects of Present Disclosure>

Hereinafter, some aspects of the present disclosure will be additionally stated.

(Supplementary Note 1)

According to an aspect of the present disclosure, there is provided a method of manufacturing a semiconductor device, the method including: pre-treating a surface of a substrate by supplying an oxygen-containing gas and a hydrogen-containing gas to the substrate heated in a process chamber under a pressure less than atmospheric pressure; and forming a film on the pre-treated substrate by performing a cycle a predetermined number of times, the cycle including: supplying a precursor gas to the substrate in the process chamber; and supplying a reaction gas to the substrate in the process chamber.

(Supplementary Note 2)

In another aspect of the present disclosure, the act of supplying the reaction gas includes supplying an oxygen-containing gas and a hydrogen-containing gas, as the reaction gas, to the substrate heated in the process chamber under the pressure less than atmospheric pressure, and the act of forming the film includes forming an oxide film, as the film, on the pre-treated substrate.

(Supplementary Note 3)

In another aspect of the present disclosure, process conditions when the oxygen-containing gas and the hydrogen-containing gas are supplied to the substrate in the act of pre-treating are set to be different from process conditions when the oxygen-containing gas and the hydrogen-containing gas are supplied to the substrate in the act of forming the film.

(Supplementary Note 4)

In another aspect of the present disclosure, a time duration for which the oxygen-containing gas and the hydrogen-containing gas are supplied to the substrate in the act of pre-treating is set to be different from a time duration for which the oxygen-containing gas and the hydrogen-containing gas are supplied to the substrate in the act of forming the film.

(Supplementary Note 5)

In another aspect of the present disclosure, a time duration for which the oxygen-containing gas and the hydrogen-containing gas are supplied to the substrate in the act of pre-treating is set to be longer than a time duration for which the oxygen-containing gas and the hydrogen-containing gas are supplied to the substrate in the act of forming the film.

(Supplementary Note 6)

In another aspect of the present disclosure, a concentration of the hydrogen-containing gas to the oxygen-containing gas and the hydrogen-containing gas when the oxygen-containing gas and the hydrogen-containing gas are supplied to the substrate in the act of pre-treating is set to be different from a concentration of the hydrogen-containing gas to the oxygen-containing gas and the hydrogen-containing gas when the oxygen-containing gas and the hydrogen-containing gas are supplied to the substrate in the act of forming the film.

(Supplementary Note 7)

In another aspect of the present disclosure, a concentration of the hydrogen-containing gas to the oxygen-containing gas and the hydrogen-containing gas when the oxygen-containing gas and the hydrogen-containing gas are supplied to the substrate in the act of pre-treating is set to be equal to or less than a concentration of the hydrogen-containing gas to the oxygen-containing gas and the hydrogen-containing gas when the oxygen-containing gas and the hydrogen-containing gas are supplied to the substrate in the act of forming the film.

(Supplementary Note 8)

In another aspect of the present disclosure, the act of pre-treating includes forming an oxide layer on the surface of the substrate by oxidizing the surface of the substrate.

(Supplementary Note 9)

In another aspect of the present disclosure, a thickness of the oxide layer is 0.1 to 10 Å (0.01 to 1 nm).

(Supplementary Note 10)

In another aspect of the present disclosure, silicon is exposed on the surface of the substrate before the act of pre-treating is performed.

(Supplementary Note 11)

According to another aspect of the present disclosure, there is provided a method of manufacturing a semiconductor device, the method including: pre-treating a surface of a substrate by supplying an oxygen-containing gas and a hydrogen-containing gas to the substrate heated in a process chamber under a pressure less than atmospheric pressure; and forming an oxide film on the pre-treated substrate by performing a cycle a predetermined number of times, the cycle including: supplying a precursor gas to the substrate in the process chamber; and supplying an oxygen-containing gas and a hydrogen-containing gas to the substrate heated in the process chamber under the pressure less than atmospheric pressure.

(Supplementary Note 12)

According to still another aspect of the present disclosure, there is provided a method of manufacturing a semiconductor device, the method including: pre-treating a surface of a substrate by supplying an oxygen-containing gas and a hydrogen-containing gas to the substrate heated in a process chamber under a pressure less than atmospheric pressure; and forming an oxide film on the pre-treated substrate by performing a cycle a predetermined number of times, the cycle including: forming a layer by supplying a precursor gas to the substrate in the process chamber; and oxidizing the layer by supplying an oxygen-containing gas and a hydrogen-containing gas to the substrate heated in the process chamber under the pressure less than atmospheric pressure.

(Supplementary Note 13)

According to still another aspect of the present disclosure, there is provided a method of processing a substrate, the method including: pre-treating a surface of a substrate by supplying an oxygen-containing gas and a hydrogen-containing gas to the substrate heated in a process chamber under a pressure less than atmospheric pressure; and forming a film on the pre-treated substrate by performing a cycle a predetermined number of times, the cycle including: supplying a precursor gas to the substrate in the process chamber; and supplying a reaction gas to the substrate in the process chamber.

(Supplementary Note 14)

According to still another aspect of the present disclosure, there is provided a substrate processing apparatus, including: a process chamber configured to accommodate a substrate; a heater configured to heat the substrate in the process chamber; a gas supply system configured to supply a gas into the process chamber; a pressure adjusting part configured to adjust an internal pressure of the process chamber; and a controller configured to control the heater, the gas supply system and the pressure adjusting part to perform a process of: pre-treating a surface of the substrate by supplying an oxygen-containing gas and a hydrogen-containing gas from the gas supply system to the substrate heated by the heater in the process chamber set to a pressure less than atmospheric pressure by the pressure adjusting part; and forming a film on the pre-treated substrate by performing a cycle a predetermined number of times, the cycle including: supplying a precursor gas from the gas supply system to the substrate in the process chamber; and supplying a reaction gas from the gas supply system to the substrate in the process chamber.

(Supplementary Note 15)

According to still another aspect of the present disclosure, there is provided a program that causes a computer to perform a process of: pre-treating a surface of a substrate by supplying an oxygen-containing gas and a hydrogen-containing gas to the substrate heated in a process chamber under a pressure less than atmospheric pressure; and forming a film on the pre-treated substrate by performing a cycle a predetermined number of times, the cycle including: supplying a precursor gas to the substrate in the process chamber; and supplying a reaction gas to the substrate in the process chamber.

(Supplementary Note 16)

According to still another aspect of the present disclosure, there is provided a non-transitory computer-readable recording medium storing a program that causes a computer to perform a process of: pre-treating a surface of a substrate by supplying an oxygen-containing gas and a hydrogen-containing gas to the substrate heated in a process chamber under a pressure less than atmospheric pressure; and forming a film on the pre-treated substrate by performing a cycle a predetermined number of times, the cycle including: supplying a precursor gas to the substrate in the process chamber; and supplying a reaction gas to the substrate in the process chamber.

According to the present disclosure in some embodiments, it is possible to provide a method of manufacturing a semiconductor device, which is capable of forming a film having excellent film thickness uniformity, a substrate processing apparatus, and a recording medium.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, the method comprising:

pre-treating a surface of a substrate by supplying an oxygen-containing gas and a hydrogen-containing gas to the substrate heated in a process chamber under a pressure less than atmospheric pressure to generate an oxidation species containing oxygen but no water; and after pre-treating the surface of the substrate, forming a film on the pre-treated substrate by performing a cycle a predetermined number of times, the cycle including: supplying a precursor gas to the substrate in the process chamber; and supplying a reaction gas to the substrate in the process chamber, wherein the act of pre-treating includes forming an oxide layer on the surface of the substrate by oxidizing the surface of the substrate by using the oxidation species, and wherein a percentage concentration of the hydrogen-containing gas to the oxygen-containing gas and the hydrogen-containing gas (the hydrogen-containing gas/(the oxygen-containing gas+the hydrogen-containing gas)) is set to be within a range of 2 to 20%.

2. The method of claim 1, wherein the act of supplying the reaction gas includes supplying an oxygen-containing gas and a hydrogen-containing gas, as the reaction gas, to the substrate heated in the process chamber under the pressure less than atmospheric pressure, and the act of forming the film includes forming an oxide film, as the film, on the pre-treated substrate.

3. The method of claim 2, wherein process conditions when the oxygen-containing gas and the hydrogen-containing gas are supplied to the substrate in the act of pre-treating are set to be different from process conditions when the oxygen-containing gas and the hydrogen-containing gas are supplied to the substrate in the act of forming the film.

4. The method of claim 2, wherein a time duration for which the oxygen-containing gas and the hydrogen-containing gas are supplied to the substrate in the act of pre-treating is set to be different from a time duration for which the oxygen-containing gas and the hydrogen-containing gas are supplied to the substrate in the act of forming the film.

5. The method of claim 2, wherein a time duration for which the oxygen-containing gas and the hydrogen-containing gas are supplied to the substrate in the act of pre-treating is set to be longer than a time duration for which the oxygen-containing gas and the hydrogen-containing gas are supplied to the substrate in the act of forming the film.

6. The method of claim 2, wherein a concentration of the hydrogen-containing gas to the oxygen-containing gas and the hydrogen-containing gas when the oxygen-containing gas and the hydrogen-containing gas are supplied to the substrate in the act of pre-treating is set to be different from a concentration of the hydrogen-containing gas to the oxygen-containing gas and the hydrogen-containing gas when the oxygen-containing gas and the hydrogen-containing gas are supplied to the substrate in the act of forming the film.

7. The method of claim 2, wherein a concentration of the hydrogen-containing gas to the oxygen-containing gas and the hydrogen-containing gas when the oxygen-containing gas and the hydrogen-containing gas are supplied to the substrate in the act of pre-treating is set to be equal to or less than a concentration of the hydrogen-containing gas to the oxygen-containing gas and the hydrogen-containing gas when the oxygen-containing gas and the hydrogen-containing gas are supplied to the substrate in the act of forming the film.

8. The method of claim 2, wherein the thickness of the oxide film is equal to or less than 10 nm.

9. The method of claim 1, wherein the thickness of the oxide layer is 0.01 to 1 nm.

10. The method of claim 1, wherein silicon is exposed on the surface of the substrate before the act of pre-treating is performed.

11. The method of claim 1, wherein the film contains at least one selected from a group consisting of a semiconductor element and a metal element.

12. The method of claim 1, wherein the film includes at least one selected from a group consisting of a SiO film, a SiN film, a SiON film, a SiCN film, a SiOCN film, a SiOC film, a SiBCN film and a SiBN film.

13. The method of claim 1, wherein the reaction gas includes at least one selected from a group consisting of an oxygen-containing gas, a nitrogen-containing gas, a carbon-containing gas and a boron-containing gas.

* * * * *